United States Patent
Dayeh et al.

(10) Patent No.: US 11,233,142 B2
(45) Date of Patent: Jan. 25, 2022

(54) INTRINSICALLY TUNABLE AND ULTRA-LINEAR MULTI-FIN MIS-HEMT DEVICES

(71) Applicant: The Regents of the University of California, Oakland, CA (US)

(72) Inventors: Shadi A. Dayeh, San Diego, CA (US); Woojin Choi, San Diego, CA (US); Renjie Chen, Albuquerque, NM (US); Atsunori Tanaka, La Jolla, CA (US); Ren Liu, La Jolla, CA (US)

(73) Assignee: The Regents of the Unverslty of California, Oakland, CA (US)

( * ) Notice: Subject to any disclaimer, the term of this patent is extended or adjusted under 35 U.S.C. 154(b) by 0 days.

(21) Appl. No.: 16/759,653

(22) PCT Filed: Oct. 31, 2018

(86) PCT No.: PCT/US2018/058407
§ 371 (c)(1),
(2) Date: Apr. 27, 2020

(87) PCT Pub. No.: WO2019/089727
PCT Pub. Date: May 9, 2019

(65) Prior Publication Data
US 2020/0295170 A1    Sep. 17, 2020

Related U.S. Application Data

(60) Provisional application No. 62/579,677, filed on Oct. 31, 2017.

(51) Int. Cl.
*H01L 29/778*    (2006.01)
*H01L 29/20*    (2006.01)
*H01L 29/78*    (2006.01)

(52) U.S. Cl.
CPC ...... *H01L 29/7783* (2013.01); *H01L 29/2003* (2013.01); *H01L 29/7786* (2013.01); *H01L 29/7787* (2013.01); *H01L 29/785* (2013.01)

(58) Field of Classification Search
CPC .............. H01L 29/7786; H01L 29/7787; H01L 29/7783
See application file for complete search history.

(56) References Cited

U.S. PATENT DOCUMENTS

| | | |
|---|---|---|
| 7,852,369 B2 | 12/2010 | Cutler et al. |
| 2007/0066018 A1 | 3/2007 | Park et al. |

(Continued)

FOREIGN PATENT DOCUMENTS

WO    20180119037 A1    6/2018

OTHER PUBLICATIONS

Palacios, T., Rajan, S., Chakraborty, A., Heikman, S., Keller, S., DenBaars, S. P., Mishra, U. K., "Influence of the dynamic access resistance in the gm and fT linearity of AlGaN/GaN HEMTs," IEEE Transactions on Electron Devices 2005, 52 (10), 2117-2123.

(Continued)

*Primary Examiner* — Grant S Withers
(74) *Attorney, Agent, or Firm* — Greer, Burns & Crain, Ltd.; Steven P. Fallon

(57) ABSTRACT

Devices and methods of the invention use a plurality of Fin structures and or combine a planar portion with Fin structures to compensate for the first derivative of transconductance, gm. In preferred methods and devices, Fins have a plurality of widths and are selected to lead to the separate turn-on voltage thresholds for the largest, intermediate and smallest widths of the MIS HEMT fins flatten the transconductance gm curve over an operational range of gate source voltage.

13 Claims, 28 Drawing Sheets

(56) References Cited

U.S. PATENT DOCUMENTS

| | | | |
|---|---|---|---|
| 2008/0315256 A1* | 12/2008 | Ohta | B82Y 10/00 |
| | | | 257/194 |
| 2010/0187575 A1 | 7/2010 | Baumgartner et al. | |
| 2014/0367796 A1 | 12/2014 | Toner et al. | |
| 2015/0249134 A1 | 9/2015 | Ostermaier et al. | |
| 2015/0372081 A1* | 12/2015 | Lee | H01L 29/775 |
| | | | 257/76 |
| 2019/0088773 A1* | 3/2019 | Armstrong | H01L 29/78 |

OTHER PUBLICATIONS

Gilbert, B., "A new wide-band amplifier technique," IEEE Journal of Solid-State Circuits 1968, 3 (4), 353-365.

Webster, D., Haigh, D., Scott, J., Parker, A., Derivative superposition—a linearisation technique for ultra broadband systems. 1996.

Kim, T. W., Kim, B., Lee, K., "Highly linear receiver front-end adopting MOSFET transconductance linearization by multiple gated transistors," IEEE Journal of Solid-State Circuits 2004, 39 (1), 223-229.

Aparin, V., Larson, L. E., Modified derivative superposition method for linearizing FET low-noise amplifiers. IEEE Transactions on Microwave Theory and Techniques 2005, 53 (2), 571-581.

Thomas, Shane, International Search Report for Application No. PCT/US2018/058407, dated Dec. 15, 2018.

Written Opinion of the International Searching Authority on the corresponding International Patent Application No. PCT/US2018/058407, dated May 5, 2020.

\* cited by examiner

| | $V_G$ (V) | -3.3 | -2.35 | -1.45 | -0.6 | \|Ratio\| (R) | Weight (α=R×F) (F=1.35) | # of fins ($N_{Fin}$) in individual devices ($W_G$=20 μm) | Product (α × $N_{Fin}$) (rounded) | Normalized # of fins in the synthesized device ($W_G$=20 μm) |
|---|---|---|---|---|---|---|---|---|---|---|
| $g_m'$ (S/V) | Planar | -3.98E-04 | - | - | - | 1 | 1 | 1 | 1 | 10.3 μm |
| | 160 nm | 2.40E-03 | - | - | - | 0.17 | 0.22 | 50 | 11 | 6 |
| | 1-Fin synthesized | - | -7.34E-04 | - | - | - | - | - | - | - |
| | 100 nm | - | 2.54E-03 | - | - | 0.29 | 0.39 | 55 | 21 | 11 |
| | 2-Fin synthesized | - | - | -4.52E-04 | - | - | - | - | - | - |
| | 80 nm | - | - | 2.49E-03 | - | 0.18 | 0.25 | 66 | 16 | 8 |
| | 3-Fin synthesized | - | - | - | -3.09E-04 | - | - | - | - | - |
| | 50 nm | - | - | - | 2.24E-03 | 0.14 | 0.19 | 80 | 15 | 8 |

Figure 14

INTRINSICALLY TUNABLE AND ULTRA-LINEAR MULTI-FIN MIS-HEMT DEVICES

PRIORITY CLAIM AND REFERENCE TO RELATED APPLICATION

The application claims priority under 35 U.S.C. § 119 and from all applicable statutes and treaties from prior provisional application Ser. No. 62/579,677 which was filed Oct. 31, 2017.

FIELD

A field of the invention is semiconductor devices and semiconductor device fabrication. The invention particular concerns metal insulator semiconductor high electron mobility transistor (MIS-HEMT) devices.

BACKGROUND

All known transistor technologies are intrinsically non-linear. This non-linearity leads to signal distortion and power loss. Non-linearity is embodied in a decrease of the transistor current gain cut-off frequency, $f_T$, and maximum oscillation frequency, $f_{max}$, with an increase in the drain current. Both $f_T$ and $f_{max}$ are directly proportional to the transistor's transconductance, $g_m$, which degrades at high drain currents. $g_m$ degradation is material dependent, and is caused by (1) mobility degradation due to interface roughness in Si devices; (2) real-space transfer of hot electrons into the barrier in GaAs and InGaAs based HEMTs; (3) self-heating effects, (4) scattering with nonequilibrium hot optical phonons, (5) emission of optical phonons, and (6) increase of the dynamic source access resistance in GaN based HEMTs. See, Palacios, T., Raj an, S., Chakraborty, A., Heikman, S., Keller, S., DenBaars, S. P., Mishra, U. K., "Influence of the dynamic access resistance in the $g_m$ and $f_T$ linearity of AlGaN/GaN HEMTs," *IEEE Transactions on Electron Devices* 2005, 52 (10), 2117-2123. In GaN devices, it has been argued that the measured saturation velocities, the current, and $g_m$, are well below the theoretical limits Recent results have shown that there is an unharnessed opportunity to dramatically improve linearity in GaN based devices Common circuit linearization techniques can inspire device layouts that enable intrinsically tunable ultra-wide band linear devices. The pioneering work of Barrie Gilbert in the late sixties and seventies outlined the use of differential pairs to obtain wideband linearity amplifiers. Gilbert, B., "A new wide-band amplifier technique," *IEEE Journal of Solid-State Circuits* 1968, 3 (4), 353-365. The approach became known as the multi-tanh principle in which an offset voltage, $V_j$, at the base of an element of the differential pair leads to the summation of the tail current of each stage which turns on sequentially. The transconductance becomes a sech function which is flat as a function of input voltage. In practical circuits, the offset voltage is generally of the order of $V_T$ in order to reduce the overall noise, and the wideband linearity cannot be sustained over a large input power without substantial increase of the amplifier's area.

In MOSFETs, the derivative superposition technique [Webster, D., Haigh, D., Scott, J., Parker, A., Derivative superposition-a linearisation technique for ultra broadband systems. 1996] and its variations [Kim, T. W., Kim, B., Lee, K., "Highly linear receiver front-end adopting MOSFET transconductance linearization by multiple gated transistors," *IEEE Journal of Solid-State Circuits* 2004, 39 (1), 223-229] including the modified derivative superposition technique [Aparin, V., Larson, L. E., Modified derivative superposition method for linearizing FET low-noise amplifiers. *IEEE Transactions on Microwave Theory and Techniques* 2005, 53 (2), 571-581] has been heavily utilized for linearizing RF circuits. It extends the $V_{GS}$ bias range through the use of two or more parallel MOSFETs with different widths and gate biases. Similar to the multi-tanh approach, this technique is extrinsic, is costly for layout area, and cannot be extended to mm wave frequencies due to circuit patristics and bandwidth limitations of the impedance matching elements.

Over the years, various approaches for enhancing the intrinsic linearity of transistors have been proposed. In 1992, D. R. Green of AT&T Bell Laboratories proposed FETs of multiple quantum well channels with different widths, depths, and carrier concentrations that have different threshold voltages. [Green, D. R., U.S. Pat. No. 7,852,369, Method of making substantially linear field-effect transistor] The design predicts that different channels in different layers underneath the gate can turn on at different gate biases thereby leading to a $g_m$ linearity. Alternative variations of this idea have been proposed for HMETs and even in vertically stacked Si nanowire channels with double or all-around gates. Practically, this concept is hard to implement because of the limited control over the threshold voltage shifts while maintaining adequate current that will synthesize to a linear device. Additionally, screening of 2D charge density at the topmost channel reduces the gate modulation efficiency to the underlying channels and control over charge carrier density in these channels. Furthermore, gate leakage currents are expected to kick in before other channels can be reliably turned on.

Palacios WO2018/119037 discloses high-linearity transistors. Two gate controlled regions have different threshold voltages. FIG. 7A shows a nanowire or fin configuration with varying widths. The fins are arranged according to the magnitudes of the peaks and/or valleys or g"m, which is the second derivative of transconductance. This is known as the derivative superposition technique, previously used widely in communication circuits.

SUMMARY OF THE INVENTION

A preferred MIS-HEMT includes a substrate, a buffer layer upon the substrate, and a plurality of multi-layer fins with channel and barrier material. The fins have a plurality of widths and are formed upon the buffer layer, gate insulator surrounds the fins and gate metal conformally covers the gate metal. The plurality of widths include largest, intermediate and smallest widths, selected to lead to the separate turn-on voltage thresholds for the largest, intermediate and smallest widths of the MIS-HEMT fins to flatten the transconductance $g_m$ curve over an operational range of gate source voltage. Preferably, the planar channel comprises a width greater than 1 µm, and all of the plurality of widths are less than 500 nm. Preferably, the plurality of widths are selected such that the threshold voltages ($V_T$) and the peak point of transconductance $g_m$ of single Fins from the plurality of Fins lift up a decreasing region of transconductance $g_m$ at higher $V_{GS}$ in larger Fins of the plurality of fins. The source and drain regions are preferably unetched. The channel and barrier materials can be Group III-V materials or silicon with different ion-implant doses. Preferably, the plurality of widths are uniformly separated by gate voltages in second derivative of transconductance $g_m$"

curves to complement each other for reducing the first derivative of transconductance $g_m'$ close to zero over the operational range.

A preferred method of compensating for the first derivative of transconductance, $g_m$, in a MIS-HEMT includes turning on a first Fin in response to a first gate source voltage. A second smaller Fin turns on in response to an increased gate voltage. A third Fin smaller than the second smaller Fin turns on in response to a larger increased gate voltage, wherein the first, second smaller, and third Fin are sized such that smaller fin devices with quantitatively calculated weights replenish the negative region of the first derivative of transconductance $g_m$ to reduce variation of $g_m$ over an operational range of gate source voltage. The method preferably includes first turning on a planar channel in response to a gate source voltage that is smaller than the first gate source voltage.

BRIEF DESCRIPTION OF THE DRAWINGS

FIG. 14 includes a summary of $g_m'$ at different $V_G$, illustrations present methods of linearization of $g_m$, and defining weights;

DESCRIPTION OF THE PREFERRED EMBODIMENTS

A preferred transistor device architecture provides a capability of intrinsically tunable ultra-wide band linearity. Preferred embodiments overcome limitations of the prior approaches in the background by providing devices that permit tuning of the threshold voltage and synthesizing the linearity of transistors using parallel channels that are formed on the surface of the substrate with consistent and controllable gate-to-channel capacitance, and that provide a larger degree of flexibility in material selection such as low work function metal electrodes to push the linearity to voltages that conventional HEMT-based devices cannot achieve. Preferred devices use a plurality of Fin structures and/or combine a planar portion with Fin structures to compensate for the first derivative of transconductance, $g_m$.

Figure 9:
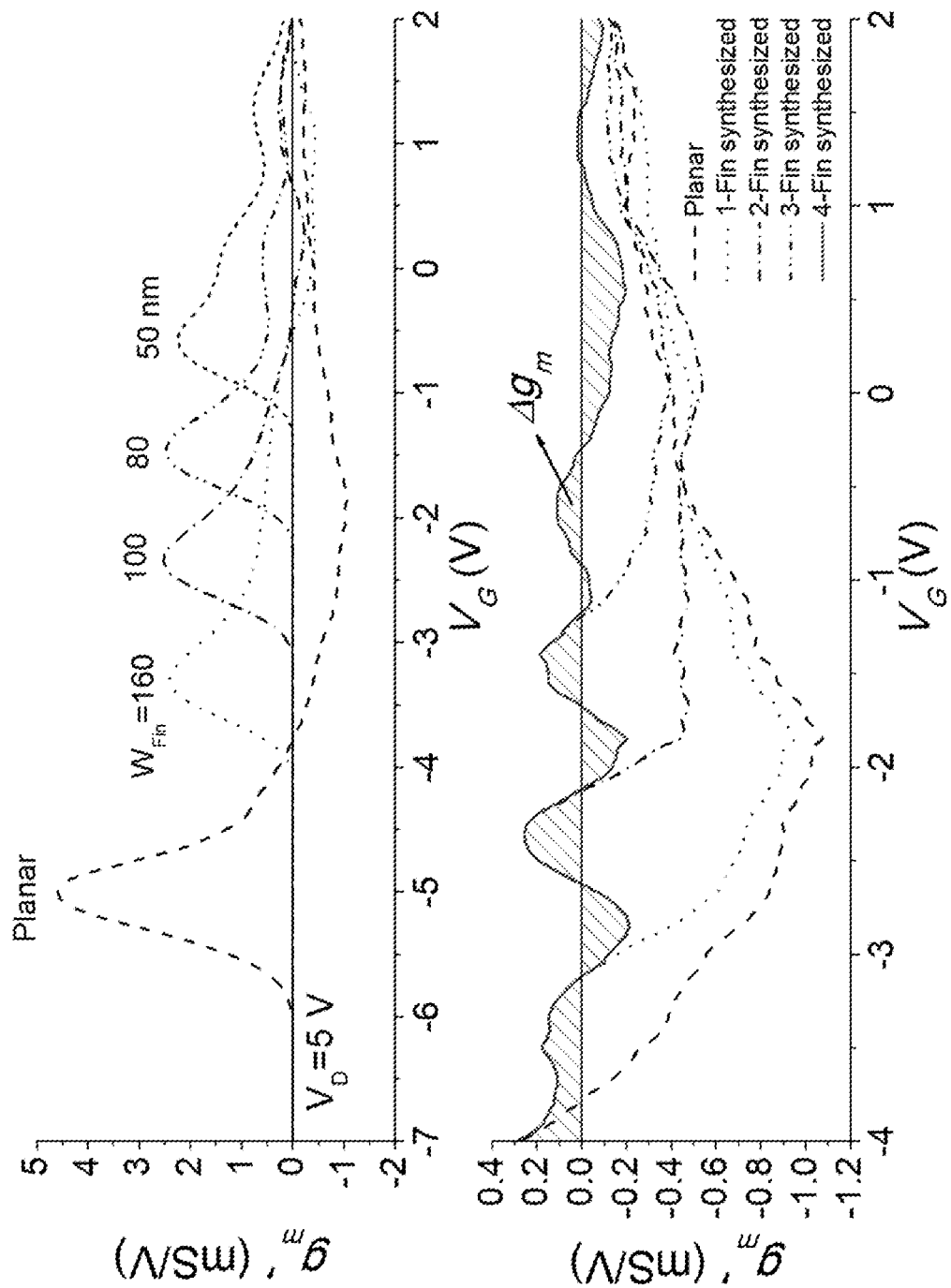
FIG. 9 are $g'_m$-$V_G$ characteristics of fabricated devices with a planar and different fin widths and synthesized devices with reduced $\Delta g_m$.

Preferred devices enable linearization with a planar channel and multiple Fin channels whose threshold voltage can be individually tuned by width of the Fin-channel, $W_{Fin}$. For a preferred planar and multi-Fin device, one can write: $I(V_{GS})=\alpha_1 I_1(V_{GS}-V_{T1})+\alpha_2 I_2(V_{GS}-V_{T2})+ \ldots +\alpha_n I_n(V_{GS}-V_{Tn})$, and $g_m(V_{GS})=\alpha_1 g_{m1}(V_{GS}-V_{T1})+\alpha_2 g_{m2}(V_{GS}-V_{T2})+ \ldots +\alpha_n g_{mn}(V_{GS}-V_{Tn})$, where an is the number of channels for a family of Fins, n, with width $W_{Fin\text{-}n}$, and threshold voltage, $V_{Tn}$, where $V_{Tn}>V_{Tn-1}$. Therefore, two simple "engineering knobs" are present in the current device architecture to control the device linearity: $W_{Fin}$ which controls the shift in the threshold voltage, $V_T$, and the amplitude $\alpha_n$ which controls the current output beyond a $V_T$ point. A planar channel device having a more negative $V_T$ than any fin devices broadens the flat $g_m$ region much further meaning a more intrinsically linear transistor. As can be seen in FIG. 9, $g_m'$ of planar device is negative after $V_G$ of −4 V, which provides a room that can be replenished by fin devices with higher $V_T$, to make a preferred device have a very broad flat $g_m$ region.

While some prior approaches have sought to use Fin HEMT devices to reduce the source access resistance and enhance the linearity, such approaches do not provide linearity that is accessible at gate voltages beyond those at which the gate Schottky diode turns on (~2 V). In contrast, preferred combined planar and Fin MIS-HEMT devices permit flexible engineering of the device threshold voltage and attaining linearity over a wider $V_{GS}$ range.

Preferred embodiments achieve an objective of intrinsically tunable high linearity GaN multi-Fin MIS-HEMT devices that can deliver wideband linearity at low DC bias with potential to exceed OIP3/PDC of 1000. The intrinsic device characteristics as a function of gate-source voltage in preferred embodiment devices can be controllably synthesized in order to provide the desired linearity, along with high $f_t$, $f_{max}$ and low noise performance. Preferred MIS Fin HEMTs provide linear transfer characteristics, through the synthesis of IDS currents from Fin HEMTs that turn on sequentially from large to small and therefore eliminate the usually reduced slope of IDS as a function of Vgs when Vgs increases beyond the 'linear regime'. In other words, the transconductance of the device usually decreases rapidly with gate voltages above $V_T$, but preferred devices provide a flat transconductance which leads to a constant gain, large bandwidth, and lower jitter. Preferred HEMTs provide a large $\Delta V_{GS}$ over which the device is linear. The large range is dependent on the number of families of FinFETs that can be integrated into the device. There are also limitations on how much the threshold voltage can be tuned for a particular device that depend upon with (1) size and (2) metal work function. HEMTs of preferred embodiments can provide linearity over a large $\Delta V_{GS}$ up to 10 V, as indicated by simulations. A largest range reported in literature known to the inventors is half or less than half of the 10V range, e.g. only from about 4.5 to 5V, which can also be lower depending upon size and metal work function, and most ranges are far less than that in reported and commercial devices.

The invention has been demonstrated with reference to, but is not limited thereby to GaN material. GaN was selected to demonstrate the present device architecture because of its well-known superior physical properties of high electron mobility and saturation velocity, high sheet carrier density and high breakdown fields. These properties make GaN a preferred choice to meet the goals of high linearity and high-power mm wave devices when used with the present architecture. GaN material is also a preferred material choice for scalable and economical production of high linearity transmitters. The present HEMT device architecture can work for any amplifier material system, including GaAs, InP, InGaAs, InGaN and others. Other materials that are suitable also have 2-dimensional electron gas (2DEG) at the interface between a barrier layer, and the side-gate effect will be the same for all this type of these heterostructures meaning that they will have the similar $V_T$ shift phenomena when the fin width is narrowed. Such transistor channel materials are remotely doped and there is less leverage on the threshold voltage control except for dramatic changes in the device gate capacitance, such as in FinFETs or nanowire FETs, to achieve tunable threshold voltages and therefore linear devices. The concept can also be applied to junctionless transistors including Si. Additionally, for Si, an adjustment of the threshold-voltage can be made by implanting the surface of the channel under the gate. As such, different ion-implant doses in parallel channels in a single Si device can achieve linear device characteristics but cannot offer the gain and speed of that for III-V materials.

Example embodiments will now be discussed to illustrate the invention. Artisans will appreciate broader aspects of the invention from the example embodiments.

Figure 1A:
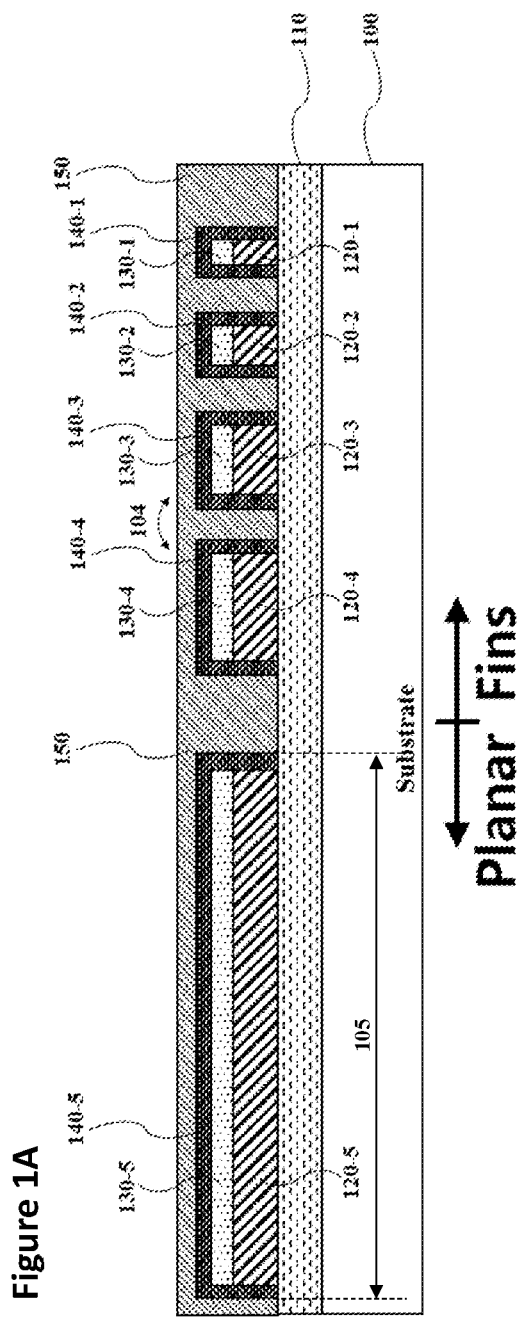
FIGS. 1A-1C are respective fragmentary cross-sectional, side perspective and top views schematically showing a preferred architecture of combined planar and multi-fin MIS-HEMTs according to the present invention.
Figure 1B:
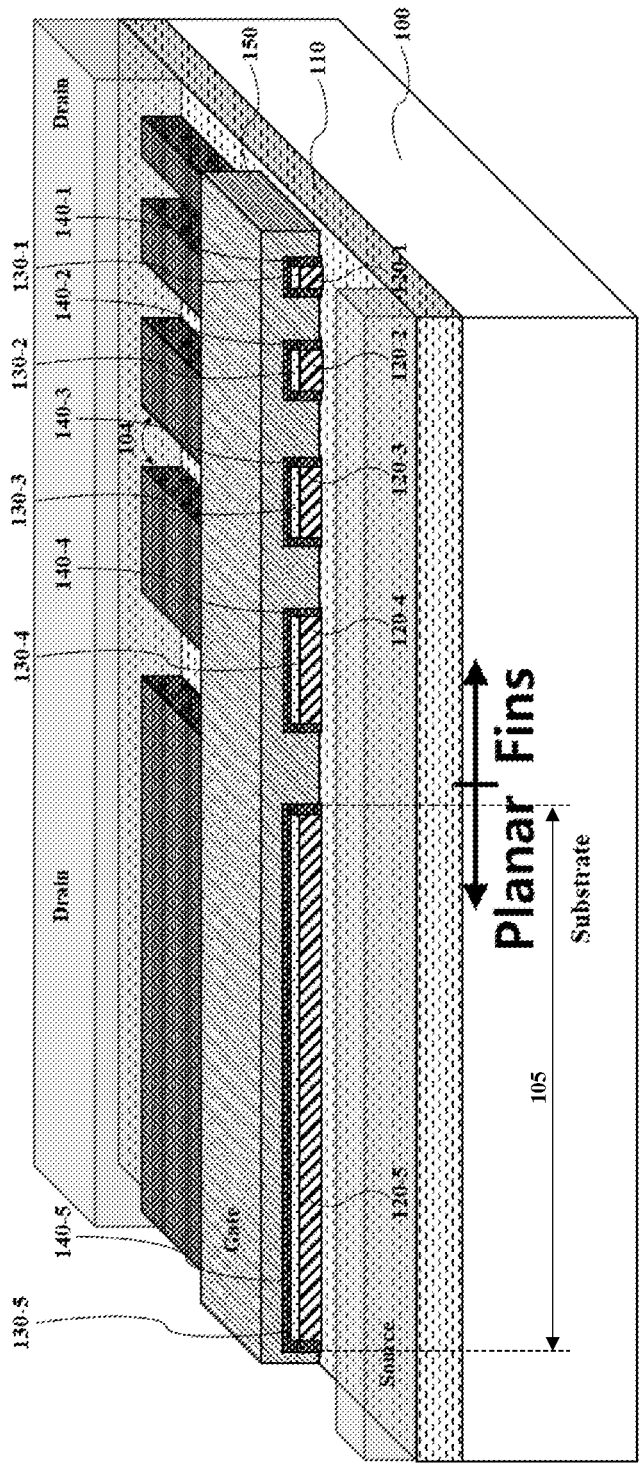
Figure 1C:
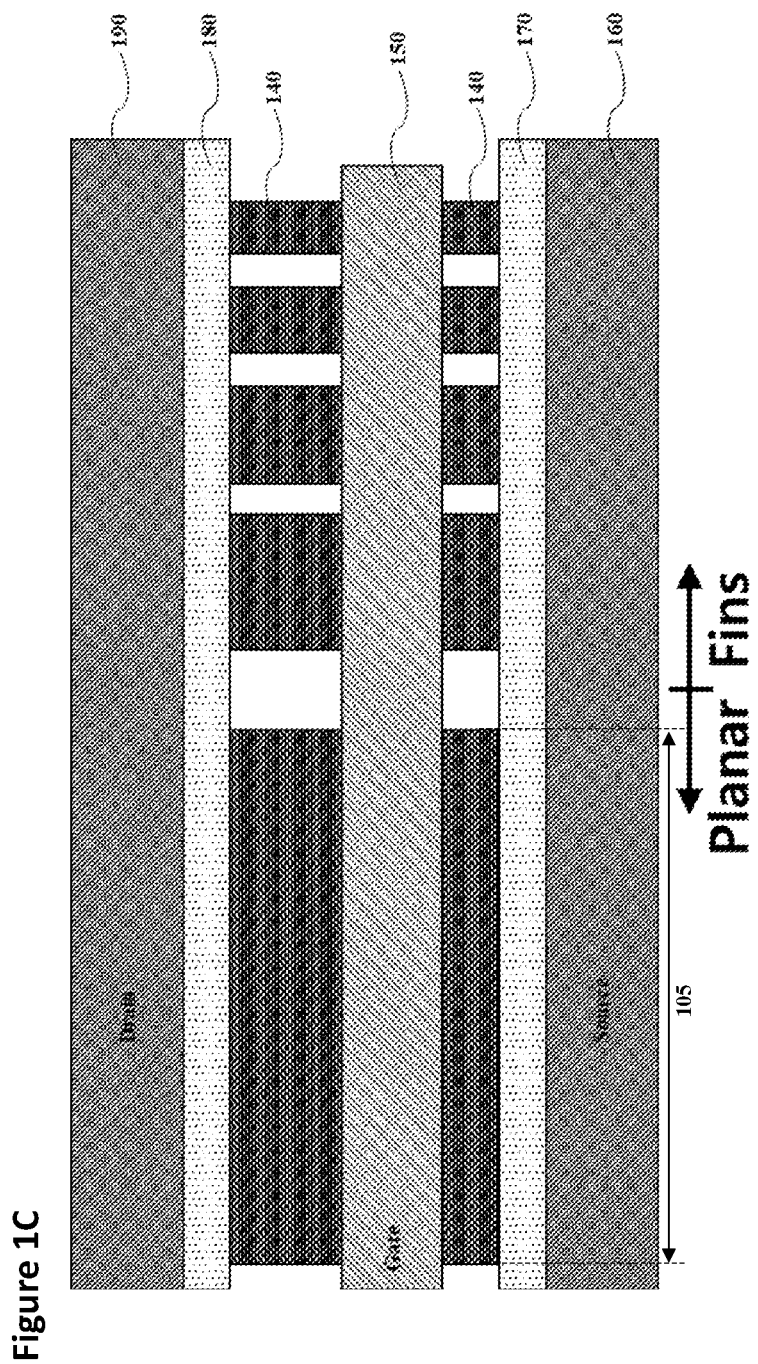

FIGS. 1A-1C illustrate an example embodiment combined planar and multi-Fin MIS-HEMTs semiconductor device architecture in an example AlGaN/GaN material, which provides for intrinsically tunable ultra linear millimeter wave devices. The basic structure includes a substrate 100, a buffer 110, AlGaN/GaN multi-fin layers including a planar region 120-$n$, 130-$n$ having fin to fin distances 104, gate insulator 140-$n$ and gate metal 150. In the example embodiment according to the present invention, the multi-Fin MIS-HEMT includes gate metal 150 and gate insulator 140-$n$, e.g. $Al_2O_3$, $HfO_2$, etc., covering multiple AlGaN/GaN fins 130-$n$, 120-$n$, sitting on top of the GaN buffer layer 110 atop a substrate 100, e.g. Si, SiC, sapphire, and GaN. The AlGaN/GaN fins 130-$n$, 120-$n$ have a width of 40 nm-1000 nm, and a height of 30 nm~1 µm. Narrower fins can provide broader $V_T$ range as long as making narrower fin is physically possible. Height should be higher than a barrier layer thickness, because gate metal should cover the sidewall of 2DEG. The width of channel 105 can define the structure as a fin or a planar, and we define a planar MIS-HEMT when the width 105 is at least 1 µm, and preferably 1 µm to 100 µm, or a few hundred µm. We also define a fin MIS-HEMT when the width 105 is 500 nm or less, and preferably 40-500 nm. The width of planar region 105 can vary from one to few hundred micrometers depending on the actual device design with respect to a desired total drain current in circuit design. The number of fins with various widths can vary from one to thousands, and the fin edge-to-edge distance 104 can also vary from few nanometers to few microns depending on the actual device layout with respect to a targeted drain current density. Generally, smaller edge-to-edge distance 104 will lead higher current density, because 2DEG is not compromised in that region. As a practical matter, the limit on smallness of the edge-to-edge distance is fabrication related to the smallest distance that can be fabricated with a conformally deposited insulator and gate metal. Less than a nanometer distance is probably practical to fabricate, and more than few microns will be inefficient in terms of current density, because there will be no 2DEG at this region. The thickness of gate insulator 140-$n$ and AlGaN barrier layer 130 can also vary from few nanometers to few tens of nanometers. The thickness of gate insulator 140-$n$ and AlGaN barrier layer 130 can also vary from few nanometers to few tens of nano meters. Usually, around 5-10 nm of a barrier layer is optimal in terms of a 2DEG density and a gate capacitance. This can be optimized for particular designs. The gate insulator 140-$n$ and gate metal 150 covers the fins conformally for a fine control of the 2-dimensional electron gas channel as well as the electron channel at the metal-insulator-semiconductor interface. "Conformally" means that insulator and gate metal cover the sidewall and the top region without thickness changes or material property changes. The cross-sectional-view, side-view, and top-view schematics in FIGS. 1A-1C illustrate how the planar region and nano-fins 120-$n$, 130-$n$ are constructed with gate insulators 140 and gate metals 150, and connected to unetched AlGaN/GaN layers for the source 170 and drain region 180, and ohmic metal 160, 190. Unetched source 170 and drain 180 regions reduces access resistance for source and drain, resulting in a lower on-resistance and a lower DC power. No complex fabrication is required, instead patterns are created during fabrication that simply expose regions between fins (140) in FIG. 1C. Fins having the same width will be turned on at the same gate bias, because $V_T$ of them are the same. As the gate bias increases, the planar region will be turned first, and the family of Fins with larger width will turn on, then another family of Fins with narrower width will turn on sequentially, so that the current keeps on increasing linearly with gate bias, and therefore, the device becomes linear. In FIG. 1B, conduction channels will be formed at the interface between 1) 130-$n$ and 120-$n$, and 2) 140-$n$ and 120-$n$. 2DEG will be formed at 130-$n$ and 120-$n$, and the channel will be formed at 140-$n$ and 120-$n$.

Figure 2B:
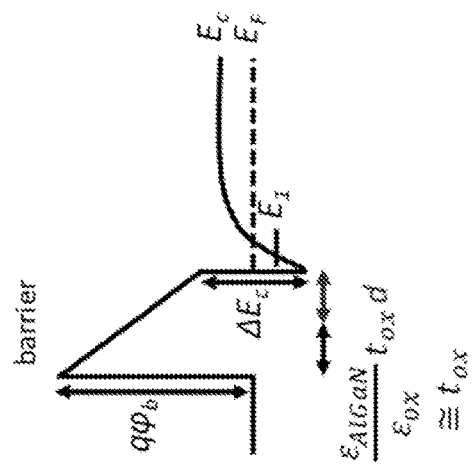
FIGS. 2A and 2B are schematic diagrams of a single Fin showing a threshold voltage calculation method for a preferred Fin MIS-HEMT according to the present invention.
Figure 2B:
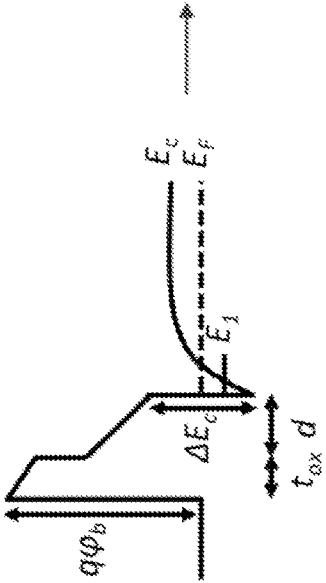
Figure 2A:
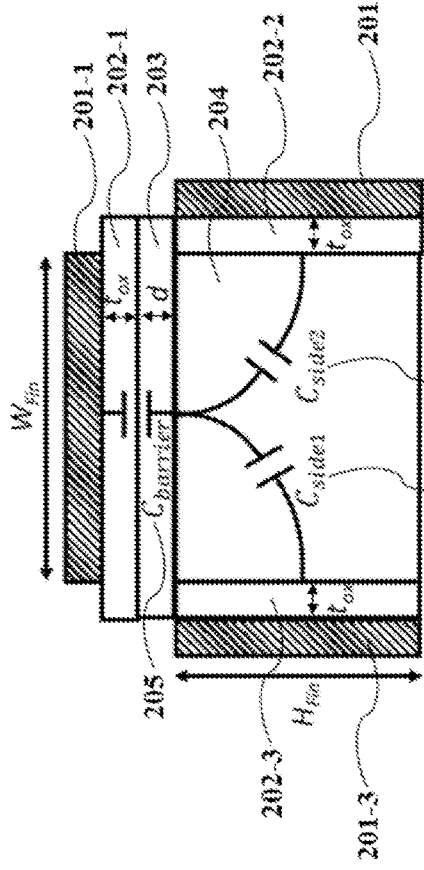

The analysis of threshold voltage in Fin structures is illustrated in FIGS. 2A and 2B. FIG. 2A shows a single Fin. Accurate analytical equations were utilized, for the determination of parasitic capacitances in 3-dimensional CMOS device structures, to determine the capacitive coupling of the side Fin MOS structure 206, 207 to the 2DEG charge density in the MIS-HEMT structure 205 and develop an intuitive model that captures the physics of threshold voltage shift in Fin MIS-HEMT devices. The side Fin structure consists of gate metal 201, insulator 202, and GaN channel layer 204. On the other hand, the top MIS-HEMT structure consists of gate metal 201, insulator 202, AlGaN barrier layer 203, and GaN channel layer 204. For an $Al_2O_3$ gate dielectric, it is reasonable to assume for simplicity that the dielectric constant ($\epsilon$) of $Al_2O_3$, AlGaN, and GaN, because of similar values of their permittivity; $\epsilon_{Al_2O_3} \cong \epsilon_{AlGaN} \epsilon\epsilon_{GaN}$. The sidegates of the Fin structure induce a shift in the charge density in the Fin channel, $\Delta Q_{side}$, according to; $\Delta Q_{side} = C_{side} \cdot V_g$; $C_{side} = 2 \cdot C_{side1}$; $C_{side1} = L_G \cdot C_1 + C_2$, where $$C_1 = \begin{cases} \frac{2\varepsilon_{GaN}}{\pi}\left[\sinh^{-1}\left[\frac{t_{ox}^2 + H_{Fin}^2 + 2(t_{ox}+d)H_{Fin}}{\sqrt{(t_{ox}+d)^2 - t_{ox}^2}}\right] - \sinh^{-1}\left[\sqrt{\frac{t_{ox}}{\sqrt{(t_{ox}+d)^2 - t_{ox}^2}}}\right]\right] \\ \quad \text{for } H_{Fin} < W_{Fin} \\ \frac{2\varepsilon_{GaN}}{\pi}\left[\sinh^{-1}\left[\frac{t_{ox}^2 + W_{Fin}^2 + 2(t_{ox}+d)W_{Fin}}{\sqrt{(t_{ox}+d)^2 - t_{ox}^2}}\right] - \sinh^{-1}\left[\sqrt{\frac{t_{ox}}{\sqrt{(t_{ox}+d)^2 - t_{ox}^2}}}\right]\right] \\ \quad \text{for } W_{Fin} < H_{Fin} \end{cases}$$

And $$C_2 = 0.35 \frac{L_G \varepsilon_{GaN}}{2\pi} \ln\left(\frac{\pi L_G}{\sqrt{(t_{ox}+d)^2 - t_{ox}^2}}\right)$$

This allows us to incorporate the effect of the side gate into the boundary conditions for the electric field at the channel side of the structure as follows $$\xi_{GaN|d} = \frac{qn_s - \Delta Q_{side}}{\varepsilon_{GaN}}$$

The electric field in the AlGaN layer at the AlGaN/GaN interface can then be expressed as $$\xi_{AlGaN|d} = \frac{qn_s - \Delta Q_{side} - \sigma_{pol}}{\varepsilon_{AlGaN}}$$

where $n_s$ is the 2DEG sheet density and $\sigma_{pol} = \sigma_{sp} + \sigma_{pz}$ is the polarization charge density due to spontaneous and piezoelectric charges. Solving Poisson's equation in the AlGaN barrier with the proper potential boundary conditions yields a threshold voltage equation that can be expressed as $$V_T = \varphi_b - \frac{\Delta E_C}{q} - \frac{qn_{th}}{\varepsilon_{AlGaN}} \cdot (d + t_{ox}) + \frac{\sigma_{pol}}{\varepsilon_{AlGaN}} \cdot (d + t_{ox}) + \frac{\Delta Q_{side}}{\varepsilon_{AlGaN}} \cdot (d + t_{ox})$$

where $n_{th}$ is the threshold 2DEG density, conventionally used as $5 \cdot 10^{10}$ cm$^{-2}$. Therefore, the threshold voltage shift as a function of Fin width can be expressed as:

$$\Delta V_T = \frac{C_{side}}{C_{barrier}}\left[\varphi_b - \frac{\Delta E_C}{q} - \frac{qn_{th}}{\varepsilon_{AlGaN}} \cdot (d + t_{ox}) + \frac{\sigma_{pol}}{\varepsilon_{AlGaN}} \cdot (d + t_{ox})\right]$$

which indicates, a stronger threshold voltage shift for larger sidewall capacitance $C_{side}$ (that is taller Fin) compared to $$C_{barrier} = \frac{\varepsilon_{AlGaN} W_{Fin} L_G}{d} + t_{ox}.$$

Figure 3A:
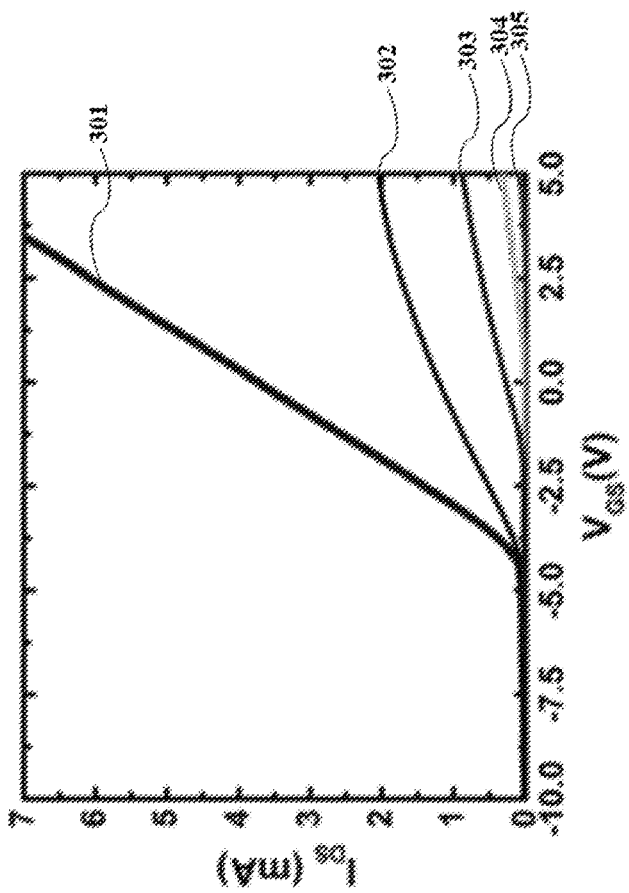
FIGS. 3A and 3B are graphical views showing transistor linearization by the multi-Fin MIS-HEMTs according to the present invention.
Figure 3B:
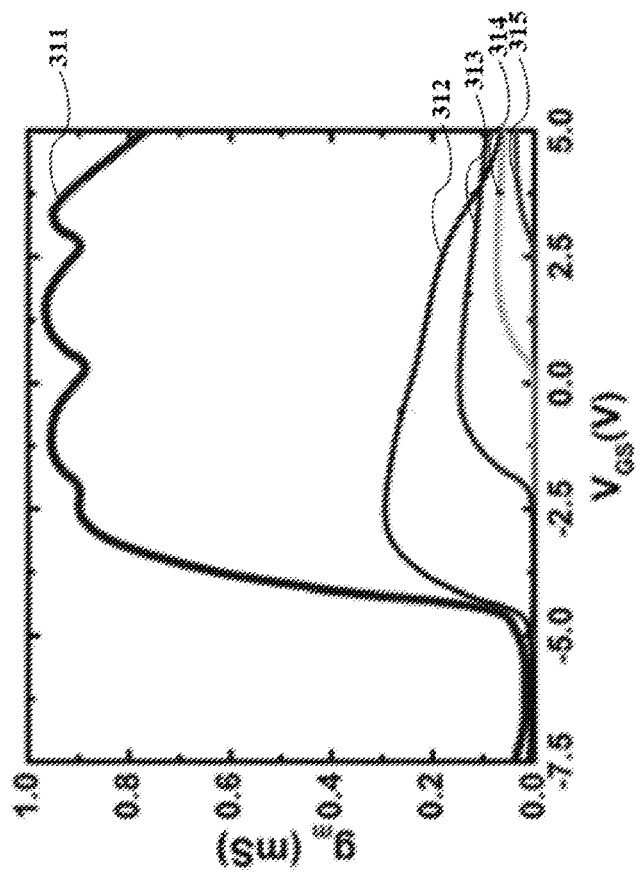

Transistor linearization over wide $V_{GS}$ by the synthesis of multi-Fin MIS-HEMTs is shown in FIG. 3A and FIG. 3B, which show typical non-linear $I_{DS}$ ($V_{GS}$) characteristics for individual Fins, consisting of the characteristics of the multi Fin device 301, 311 and a planar device ($W_{channel}$ of 1000 nm) 302, 312, single Fin devices with Fin width of 300 nm 303, 313, 100 nm 304, 314, 50 nm 305, 315, but a linearized transfer characteristics when a combination of Fins with different widths. As demonstrated in FIG. 2, by decreasing the width of the Fin, the threshold voltages ($V_T$) and the peak point of $g_{11}$ of single Fin MIS-HEMTs shift to positive direction of $V_{GS}$. $g_m$ is transconductance, $$\frac{dI_D}{dV_G}$$

which is the first derivative of $I_D$ by $V_G$. By utilizing this $V_T$ and $g_{m,peak}$ shift phenomenon, the plateau of $g_m$ can be widened by lifting up the decreasing region of $g_m$ at high $V_{GS}$ in the larger Fin devices by compensating of small Fin devices which have still increasing $g_m$ at high $V_{GS}$. The characteristics of the multi Fin device 301, 312 is the sum of 3, 1, 3, and 8 Fins with the channel width of 1000 nm 302, 312, 300 nm 303, 313, 100 nm 304, 314, and 50 nm 305, 315, respectively. The weight of this sum can vary based on the real device characteristics. Noting that the $I_{DS}$ does not saturate beyond the $g_m$ roll-off voltage, especially for Fins, linearization can be achieved, for example, with a planar FET, multiple elements of larger current carrying Fins (wide-largest width), a few Fins with intermediate current capacity (intermediate width), and the largest number of small current capacity Fins (smallest width). This situation is illustrated in FIG. 3B where such a combination can lead to linearization of the $g_m$ curve over $\Delta V_{GS} = 8V$. The decrease of drain current is mainly due to small Fin width, and it should be noted that the normalized drain current density of small Fin width devices by the Fin widths were similar or slightly higher than large Fin width devices. In example preferred devices, a width range is 130~200 nm for the widest fin, 70130 nm for the middle fins, and less than 70 nm for the narrow fins. However, the ranges are affected by epitaxial layer structures and 2DEG density. The selection of the number of Fins and the Fin widths, depends primarily on the threshold voltage and the current carrying capacity. Dimensions can also change with particular material specifications, such as the thickness of the AlGaN barrier layer.

Figure 4:
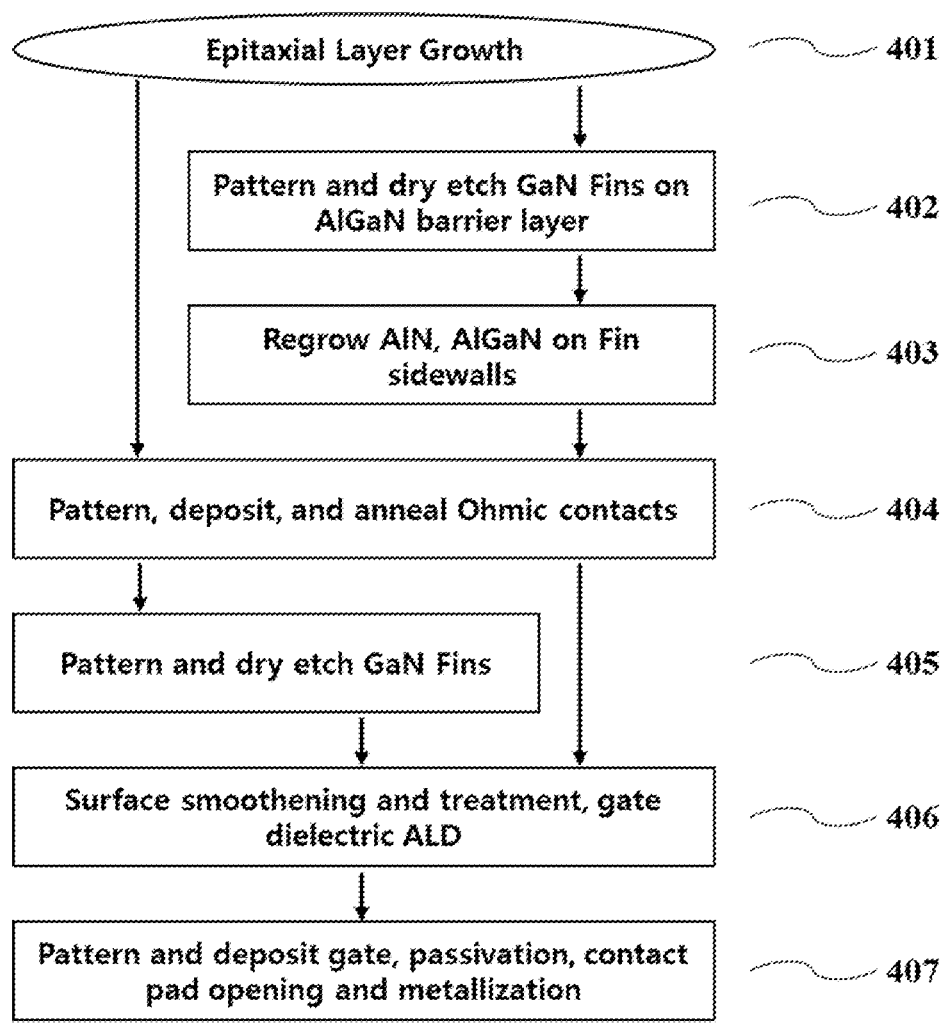
FIG. 4 is the process flow for a preferred fabrication method according to the present invention.

A preferred fabrication process flow is described in FIG. 4. AlGaN/GaN epitaxial layer growth 401 is conducted. For the ohmic contact first process, patterning, deposition, and annealing of ohmic contact 404 is performed, and GaN Fin etching 405, surface smoothening by TMAH- or KOH-based wet chemicals and gate dielectric deposition 406, and gate metallization and passivation 407 follows. On the other hand, for the GaN Fin etching first process, patterning and GaN Fin etching 402 and regrowth of AN and AlGaN layers on the Fin sidewalls 403 is performed prior to the ohmic contact formation 404. Then, the surface treatment and gate dielectric deposition 406 and gate metallization and passivation 407 steps is performed. Generally, the method improves intrinsic linearity of transistors by using lithographical changes to provide the preferred structures.

Figure 5:
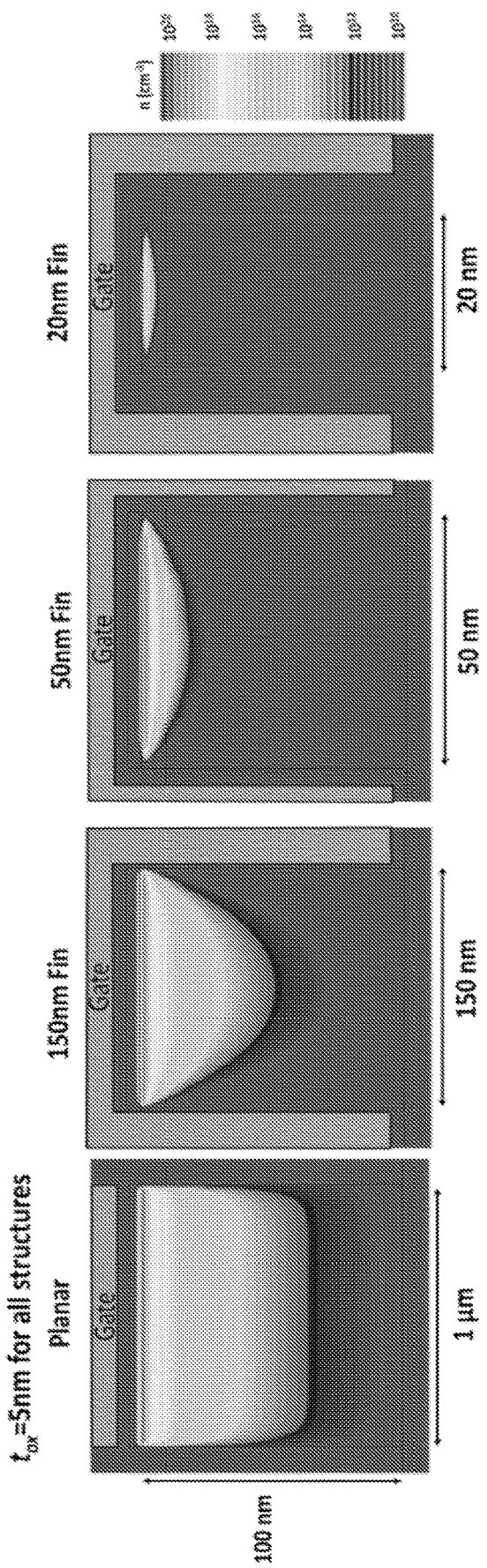
FIG. 5 shows Silvaco Atlas simulations for the electron density in the cross-section of a planar strip (1 µm wide) and different Fin widths
Figure 6:
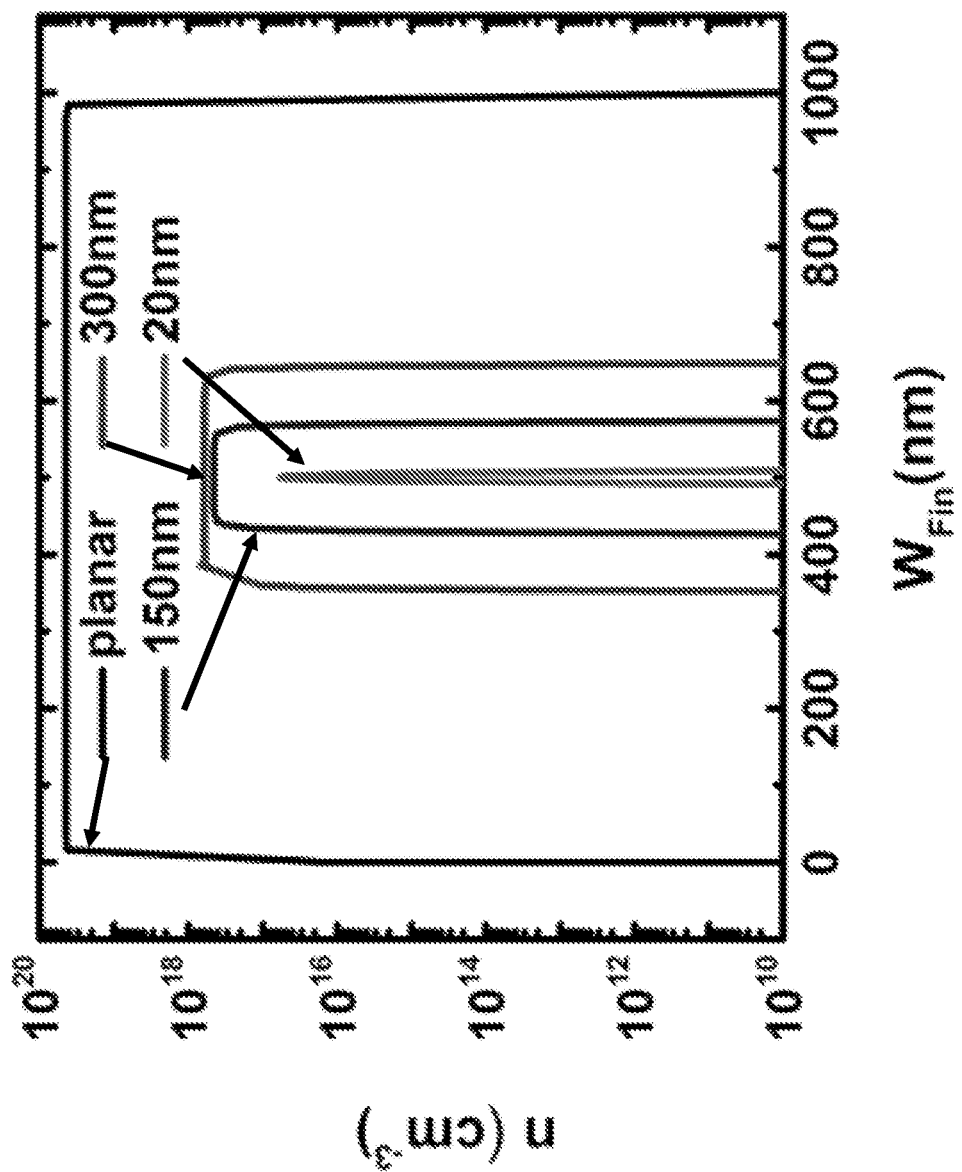
FIG. 6: Line cut of carrier concentration 1 nm below AlGaN barrier for planar and Fin structures

Silvaco Atlas simulations that capture the 3D electrostatics of tri-gate Fin-MIS-HEMTs can be utilized to gain further insights into the device performance and extract the DC characteristics of the device for utility in the mm-wave simulations. FIG. 5 shows the effect of the sidewall gate on the electron density in the Fin-MIS-HEMT in the cross-section under the gate, for different Fin widths, at thermal equilibrium ($V_{GS}=V_{DS}=0$ V). The sidewall gates significantly reduce the electron density in the channel for the same gate bias. A line cut taken at 1 nm below the AlGaN barrier (d=5 nm) in the GaN layer to display the carrier concentration is shown in FIG. 6. The Fin-MIS-HEMT reduced the electron concentration in the channel by nearly two orders of magnitude. This reduction of carrier concentration is enhanced for narrower Fins.

Figure 7A:
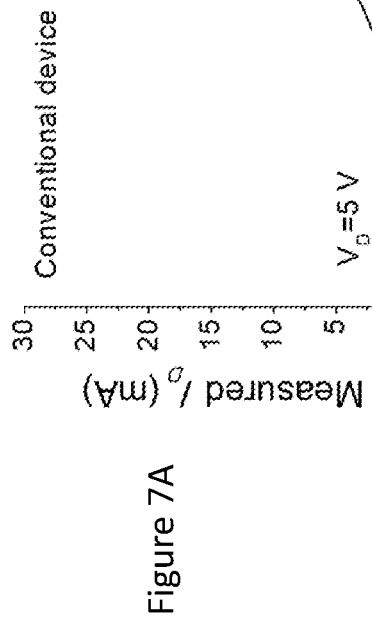
FIGS. 7A-7F illustrates measured characteristics of a conventional planar device (FIGS. 7A, 7C, and 7E) and the linearization provided by the invention (FIGS. 7B, 7D, and 7F)
Figure 7B:
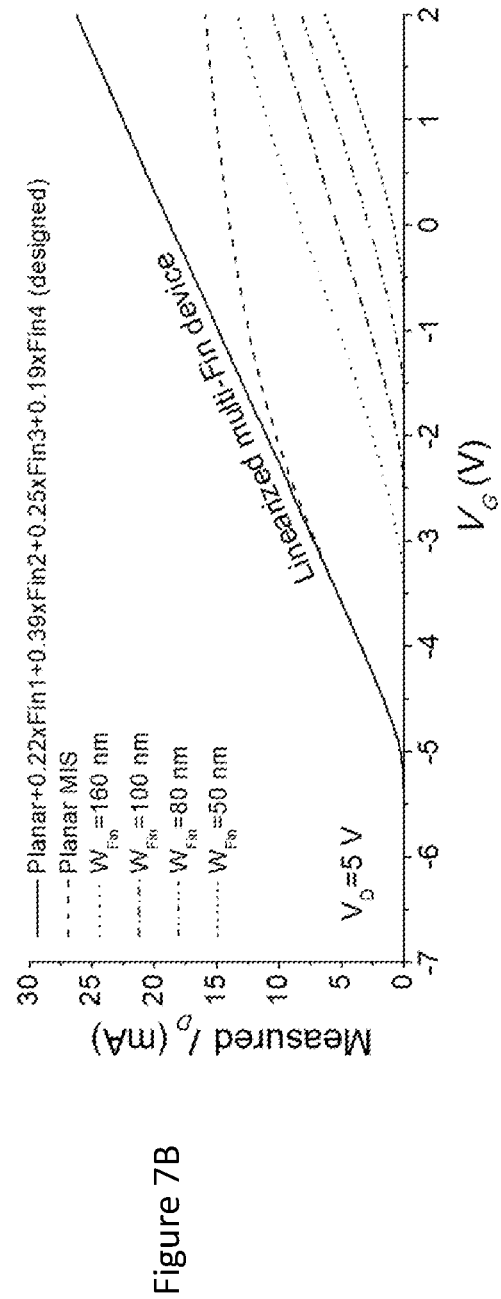
Figure 7C:
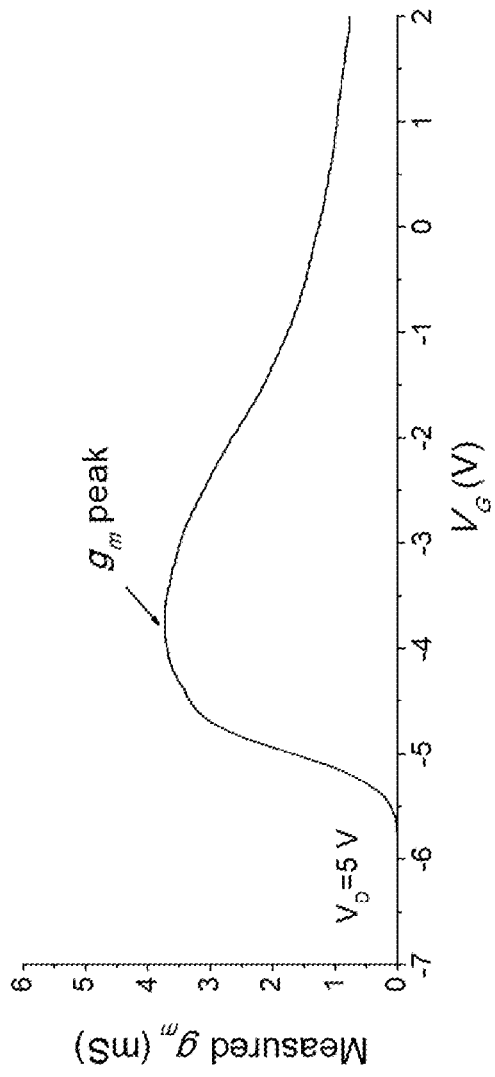
Figure 7D:
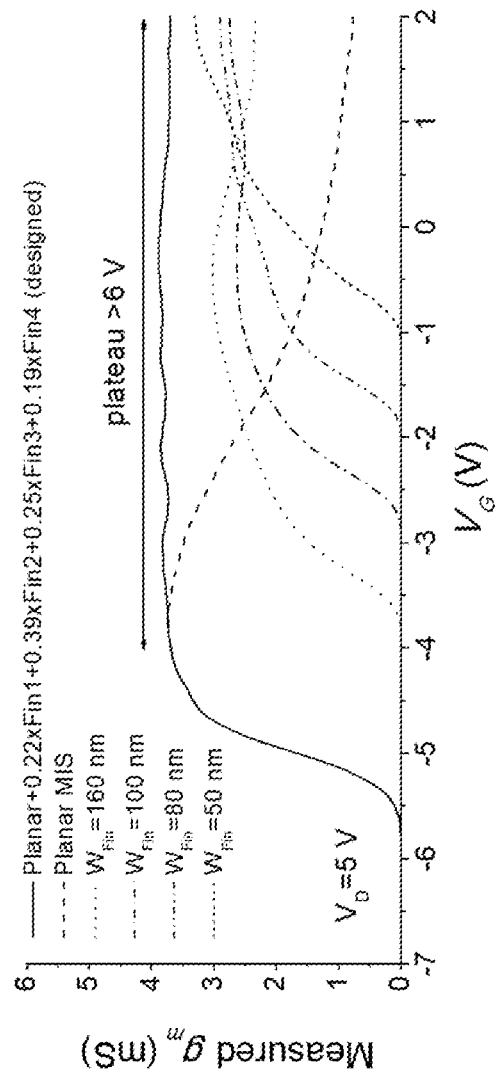
Figures 7E, 7F:
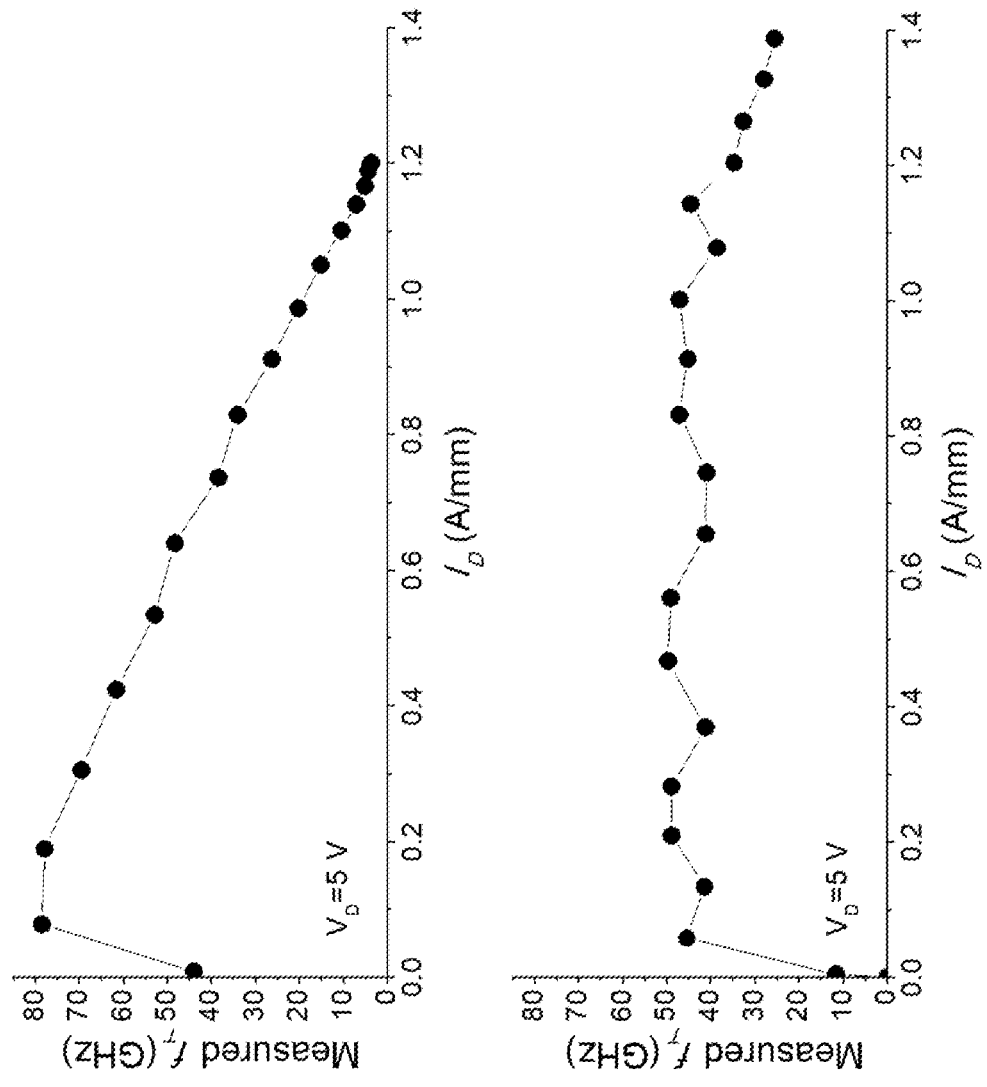

In an important aspect of the invention, the benefits offered by conventional planar MIS-HEMTs are combined with narrow Fin-HEMTs for much wider-range tuning of threshold voltages ($V_T$) as well as a linearized drain current ($I_D$). In order to widen the $g_m$ plateau much further for higher linearity, we designed a synthesized multi-Fin MIS-HEMT with weights of 1, 0.22, 0.39, 0.25 and 0.19 for planar, 160, 100, 80, and 50 nm fins, respectively, (see straight lines in FIGS. 7B and 7D (FIG. 7B shows ID-$V_G$ curves and 7D shows gm-$V_G$ curves. Both figures are illustrating linearized characteristics)). The detailed method of this linearization is discussed below.

Figure 8:
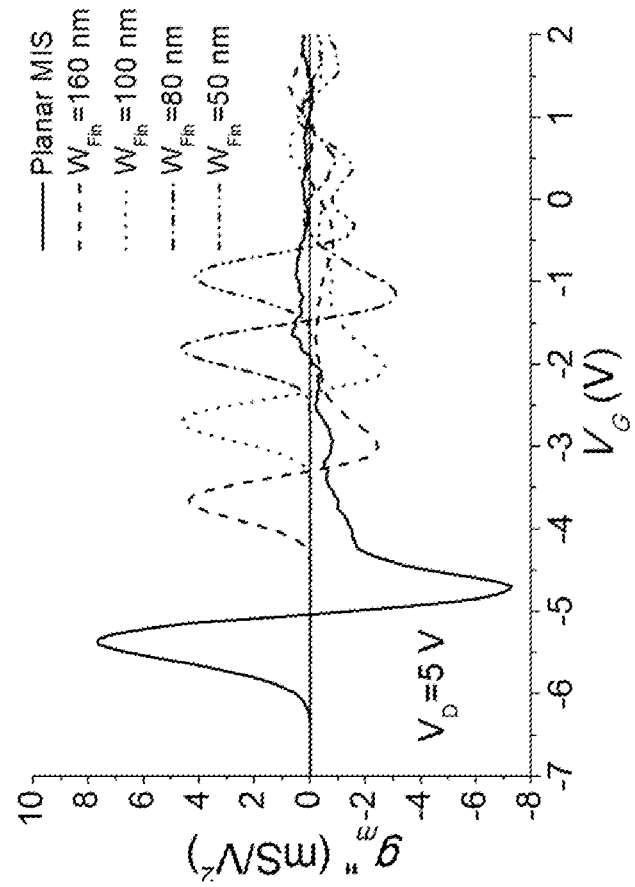
FIG. 8 are $g''_m$-$V_G$ characteristics of experimental fabricated devices with a planar and different fin widths.
Figure 10:
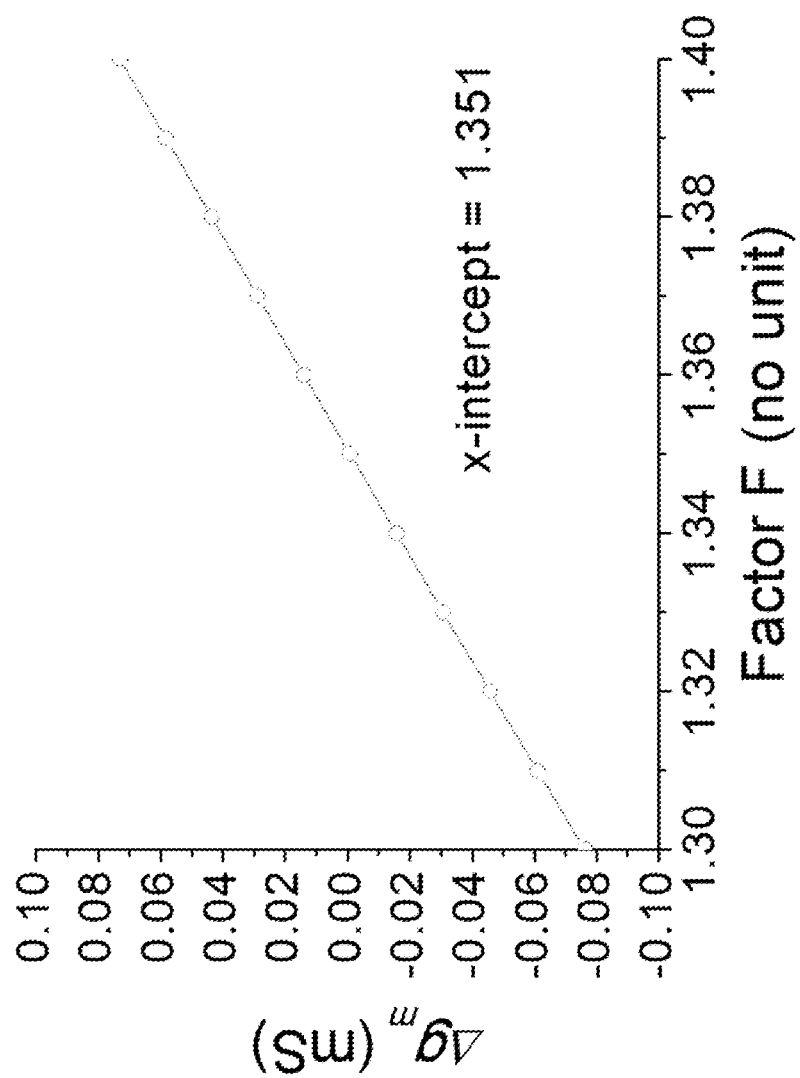
FIG. 10 includes data showing an effect of factor F on $\Delta g_m$.

In order to quantitatively approach gm compensation method, we can express the $I_D$, $g_m$, and $g'_m$ for the multi-Fin device with different $W_{Fin}$ as $$I_{D,total}(V_{GS})=\alpha_1 I_{D,1}(V_{GS}-V_{T,1})+\alpha_2 I_{D,2}(V_{GS}-V_{T,2})+\ldots+\alpha_n I_{D,n}(V_{GS}-V_{T,n})$$

$$g_{m,total}(V_{GS})=\alpha_1 g_{m,1}(V_{GS}-V_{T,1})+\alpha_2 g_{m,2}(V_{GS}-V_{T,2})+\ldots+\alpha_n g_{m,n}(V_{GS}-V_{T,n})$$

$$g'_{m,total}(V_{GS})=\alpha_1 g'_{m,1}(V_{GS}-V_{T,1})+\alpha_2 g'_{m,2}(V_{GS}-V_{T,2})+\ldots+\alpha_n g'_{m,3}(V_{GS}-V_{T,n}),$$

where $\alpha_n$ is the weight of nth channels for a family of Fins with a $W_{Fin,n}$, and a $V_{T,n}$. Therefore, there are two options to control the drain current of the multi-Fin device to control its linearity, since $W_{Fin,n}$ determines $V_{T,n}$ and $g_{m,n}$, so we can use $W_{Fin}$ and unto engineer the shape of $I_{D,total}$ for a flat $g_m$. To demonstrate an example, we chose a planar device and 4 different Fin devices with $W_{Fin}$ of 160, 100, 80, and 50 nm, because they are uniformly separated by gate voltages in $g_m''$ curves, see FIG. 8, meaning that fins will complement each other for making $g_m'$ close to zero. (The notation means derivative. So, $g_m'$ is the first derivative of $g_m$, and $g_m''$ is the second derivative of $g_m$). Plotted $g_m'$ curves in FIG. 9 are smoothened one-time by 7-points averaging to see their characteristic shapes clearly. Only experimental data are presented in FIG. 7 onwards. The planar device had negative $g_m'$ values for $V_G>-4$ V and didn't go back to positive values signifying that $g_m$ keep only decreasing. Therefore, we focused on making the integral of the $g_m'$ of the planar device zero for $V_G$ from −4 V to 2 V. To replenish this negative $g_m$, we can use other positive $g_m'$ curves for such $V_G$ regions with Fin devices having higher $V_T$. To simply minimize the negative $g_m'$ of the planar device, we determined $\alpha_n=R\times F$, where R is defined as dividing the $g_m'$ value of the overall device we want to linearize by that of the specific Fin component at a certain gate voltage for the $g_m'$ peak, see Table 1, and F is an elevating factor to minimize the integration of $g_m'$ from −4 V to 2 V which corresponds to $\Delta g_m$. Using the expected synthesized device result, this $g_m$ compensation was performed total 4 times for each Fin component with higher $V_T$. Given that R is fixed based on the synthesized data, on the other hand, F was varied to minimize $\Delta g_m$, and the optimum F of 1.35 was achieved, see FIG. 10. Finally, the optimized weights were 1, 0.22, 0.39, 0.25, and 0.19 for a planar, $W_{Fin}$ of 160, 100, 80, and 50 nm, respectively, resulting in the expected $\Delta g_m$ of −0.7 μS with respect to $V_G$ from −4 V to 2 V for the 4-Fin synthesized device which is more than 4 orders of magnitude reduction from that of the planar device.

Figure 11:
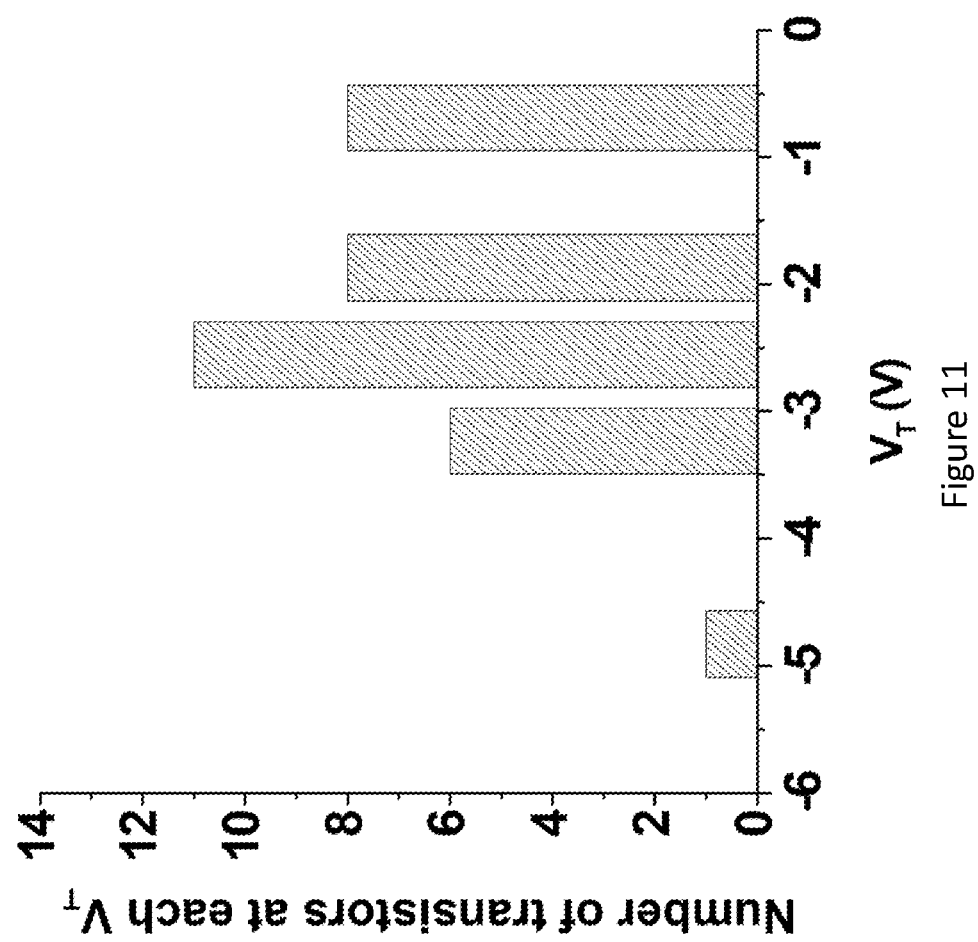
FIG. 11 is plot of the number of transistors at each threshold voltage.
Figure 12:
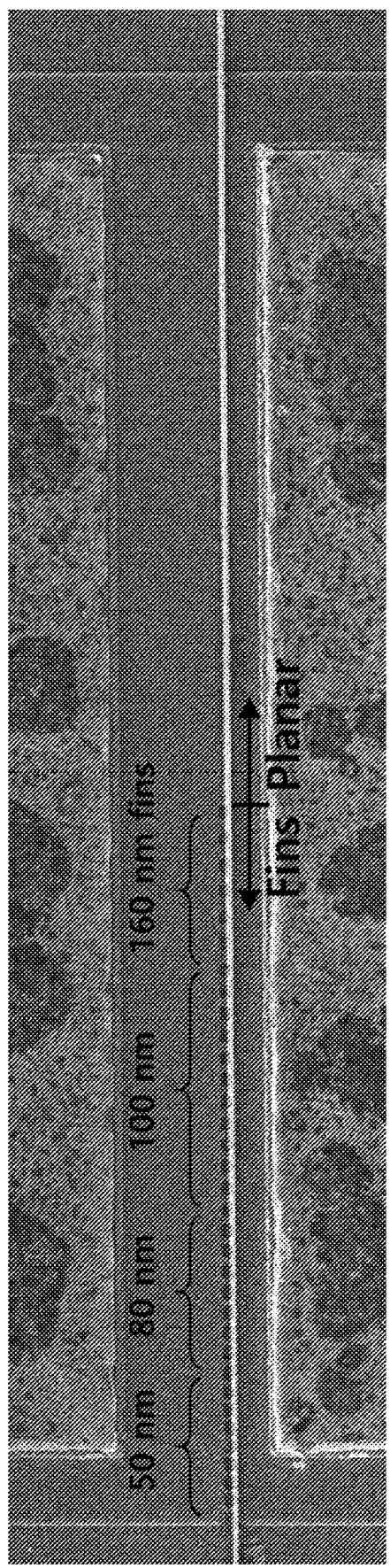
FIG. 12 is a top-view SEM image of a fabricated multi-fin MIS-HEMT device.
Figure 13A:
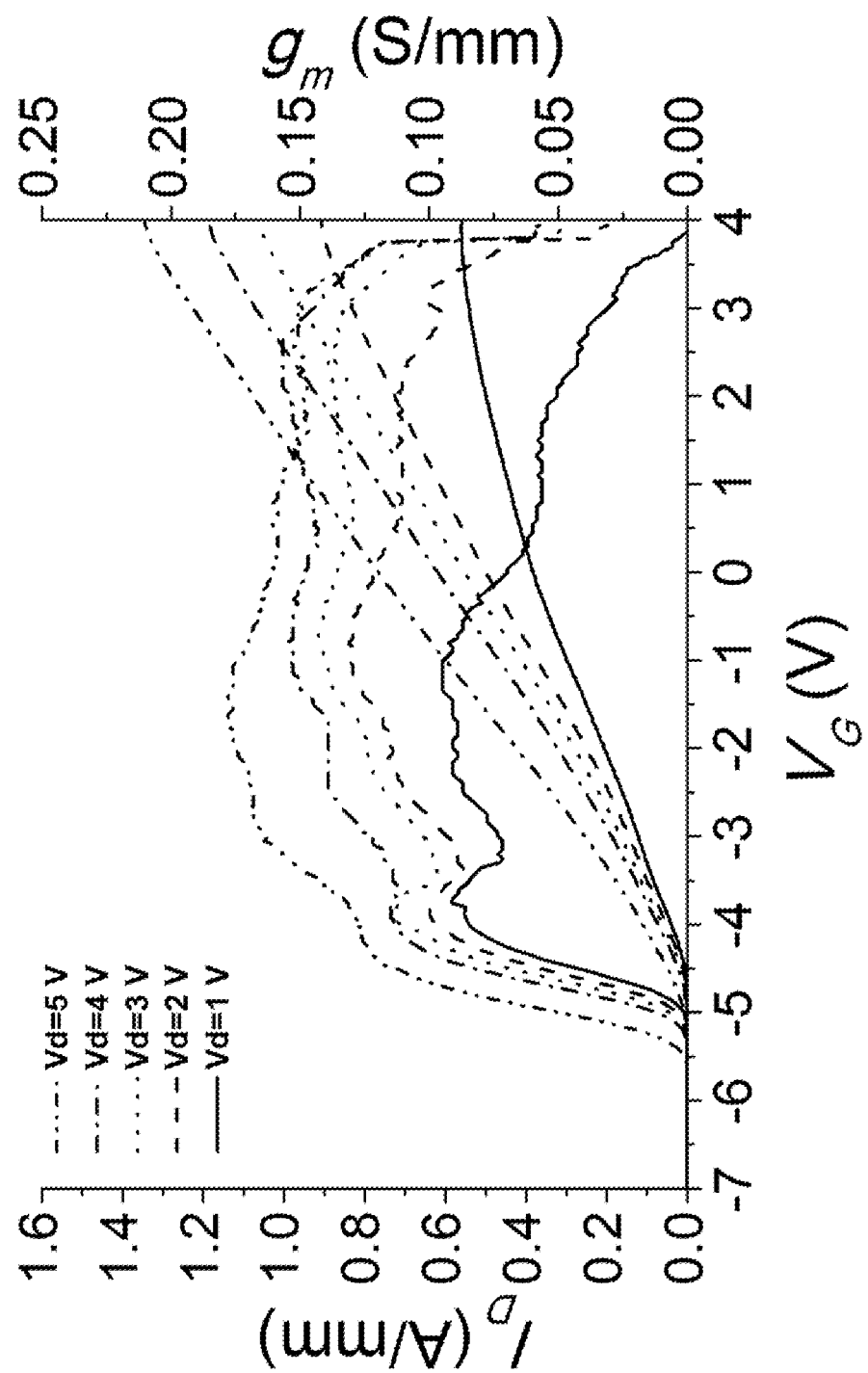
FIGS. 13A 13D are data plots of device characteristics of a preferred embodiment multi-fin MIS-HEMT.
Figure 13B:
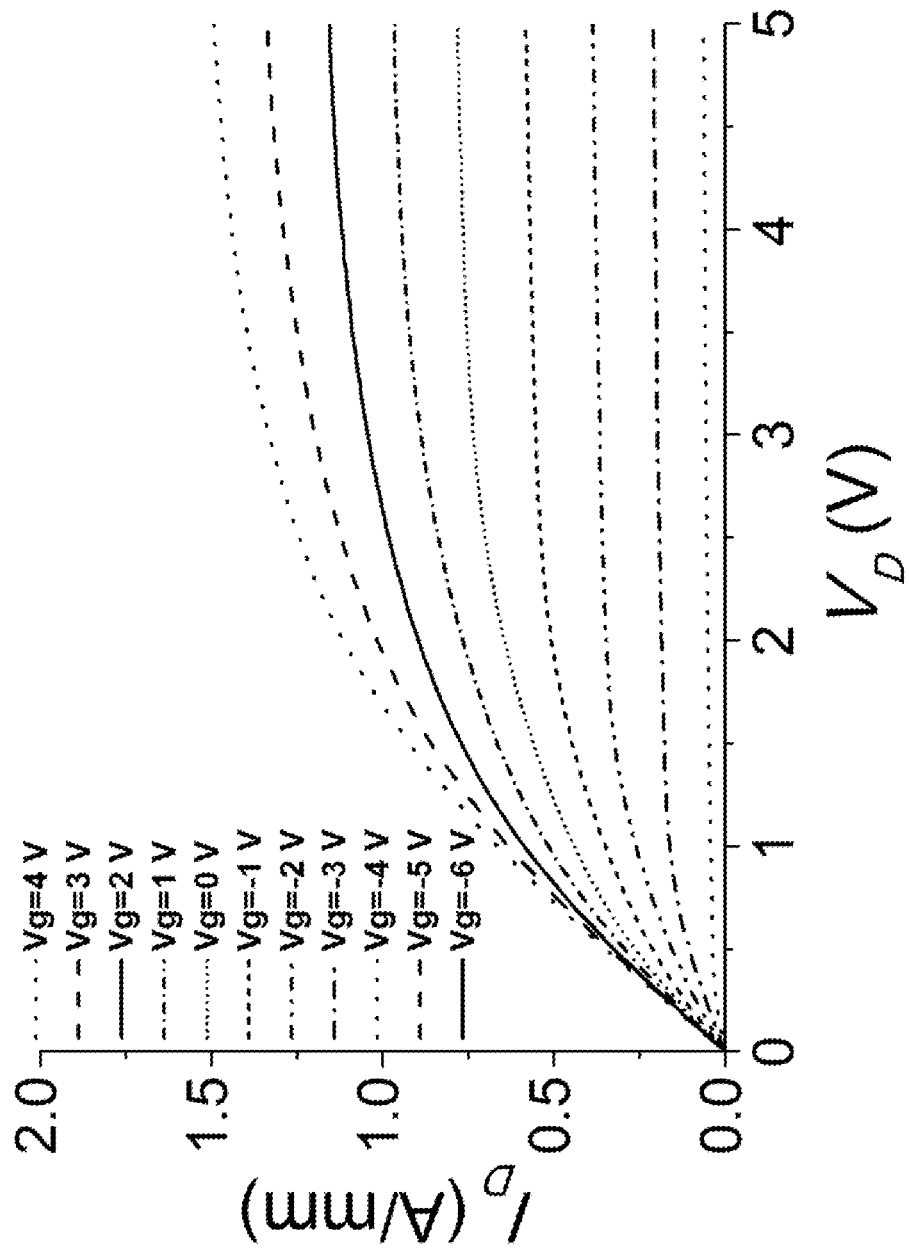
Figure 13C:
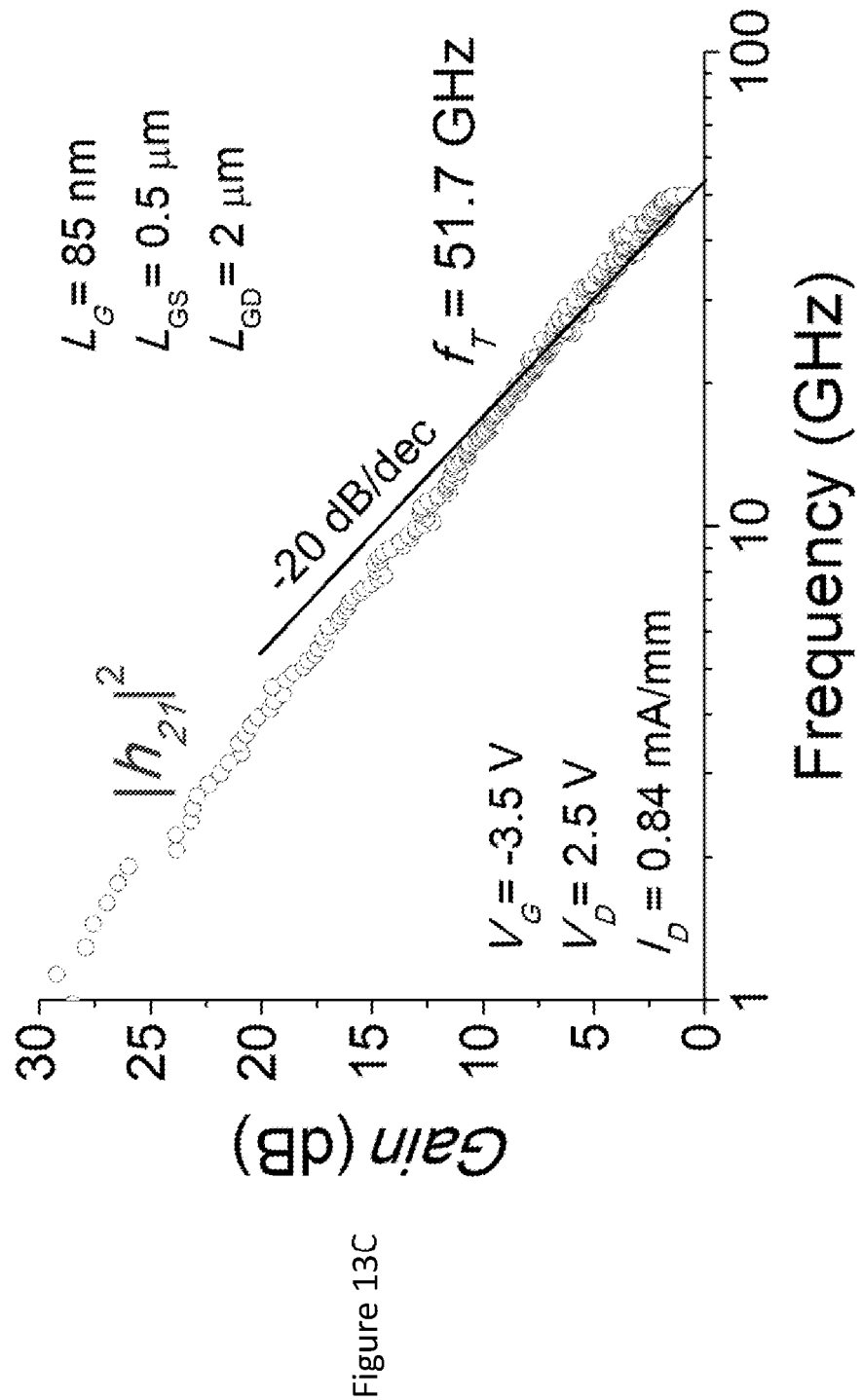
Figure 13D:
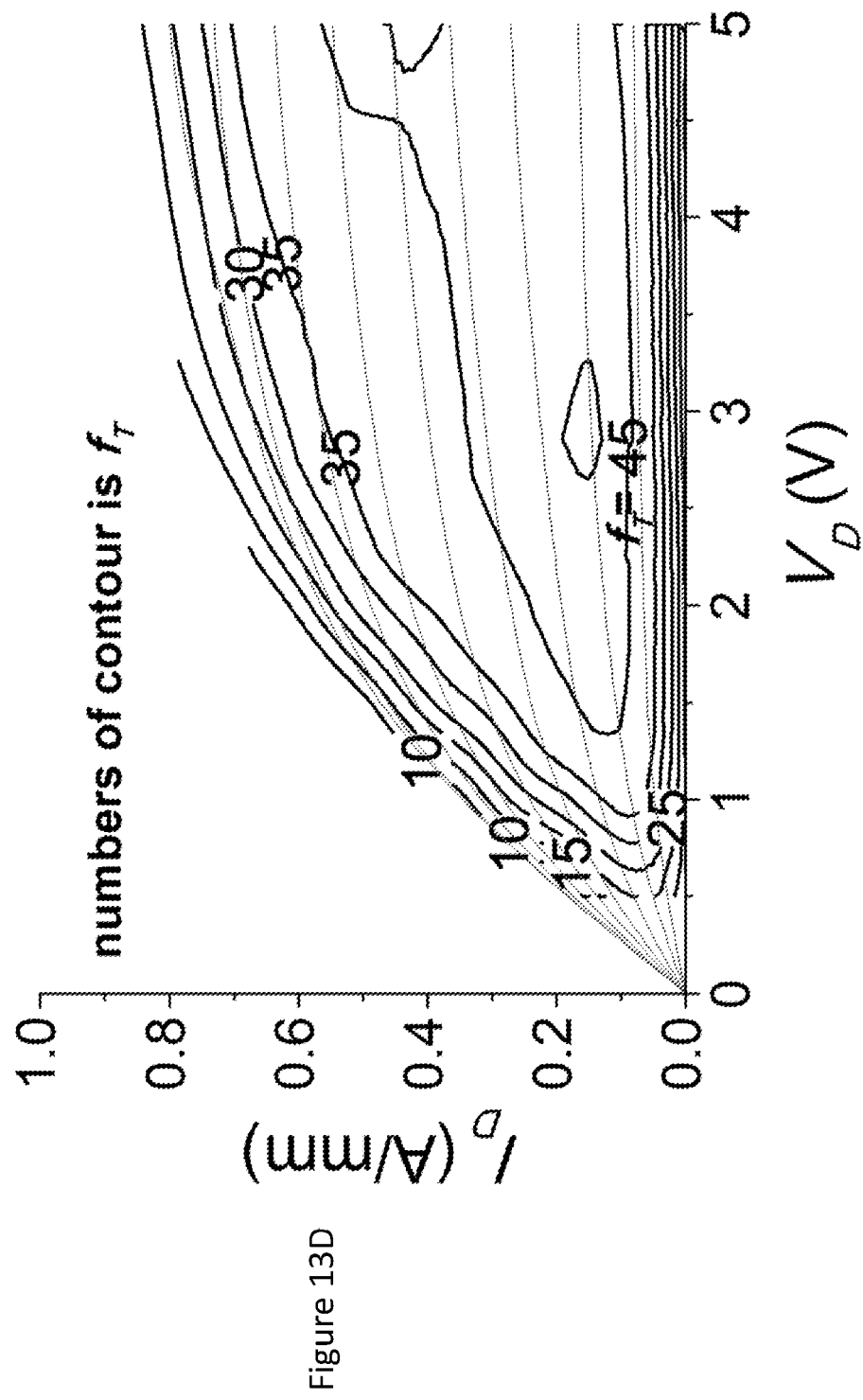

The actual numbers of fins in the device layout were determined by multiplying the weight ($\alpha_n$) and the original number of fins in the individual device ($N_{Fin}$), for example we multiplied α of 0.22 and $N_{Fin}$ of 50 for $W_{Fin}$ of 160 nm and rounded it to obtain a natural number of 11, because the number of fins cannot be a fractional number, see the table in FIG. 14. Then, the total channel width including the gap between each fin ($W_{gap}$ of 200 nm) was calculated and normalized to 20 μm for the same device dimension ($W_G$ of 20 μm). As a result, the width of planar device was calculated to 10.3 μm, and the number of fins were 6, 11, 8, and 8 for $W_{Fin}$ of 160, 100, 80, and 50 nm, respectively, and it is plotted in FIG. 11. It should be noted that the present design works in practice as evidenced by our experimental results. With the described design, a multi-Fin MIS-HEMT was fabricated with the same process. In FIG. 12, a top-view SEM image shows a planar region and a fin region with the given numbers of fins for each $W_{Fin}$, and they are integrated well in one device with the same $W_G$. Measured ID-$V_G$ and $g_m$-$V_G$ characteristics are plotted in FIGS. 13A-13D. The characteristics illustrate significantly improved linearity of the fabricated device. ID-VD characteristics with extracted $f_T$, unity current gain frequency (frequency when the current gain becomes unity), contour plot in FIG. 13 strongly suggest that the device have $f_T>40$ GHz over most of the saturation region.

Figure 15A:
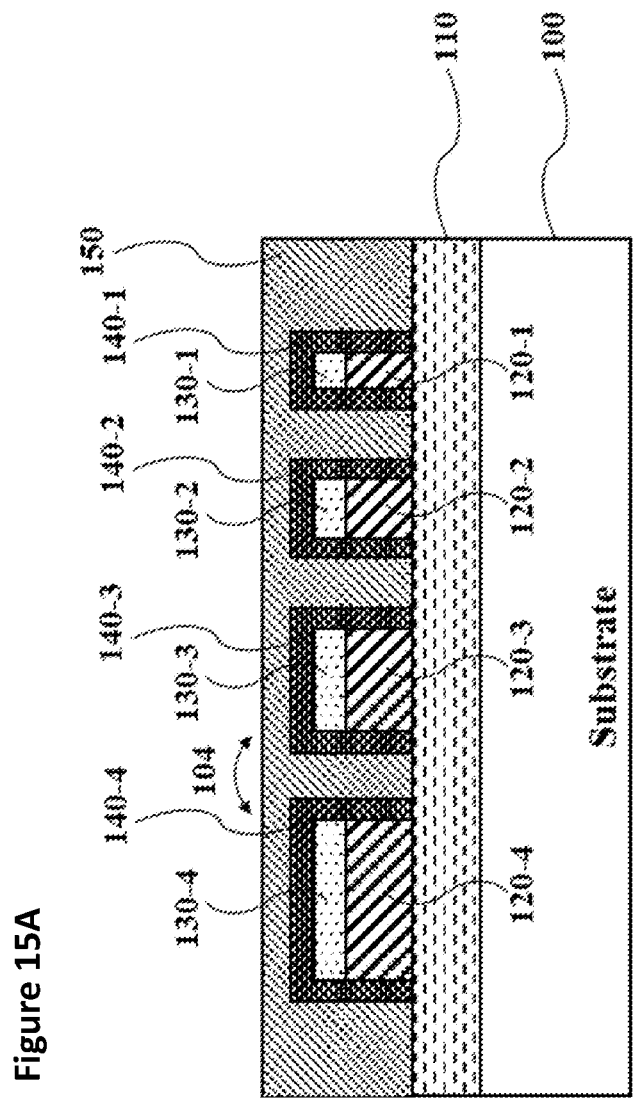
FIGS. 15A-15C are respective fragmentary cross-sectional, side perspective and top views schematically showing a preferred architecture of a multi-fin MIS-HEMT according to the present invention.
Figure 15B:
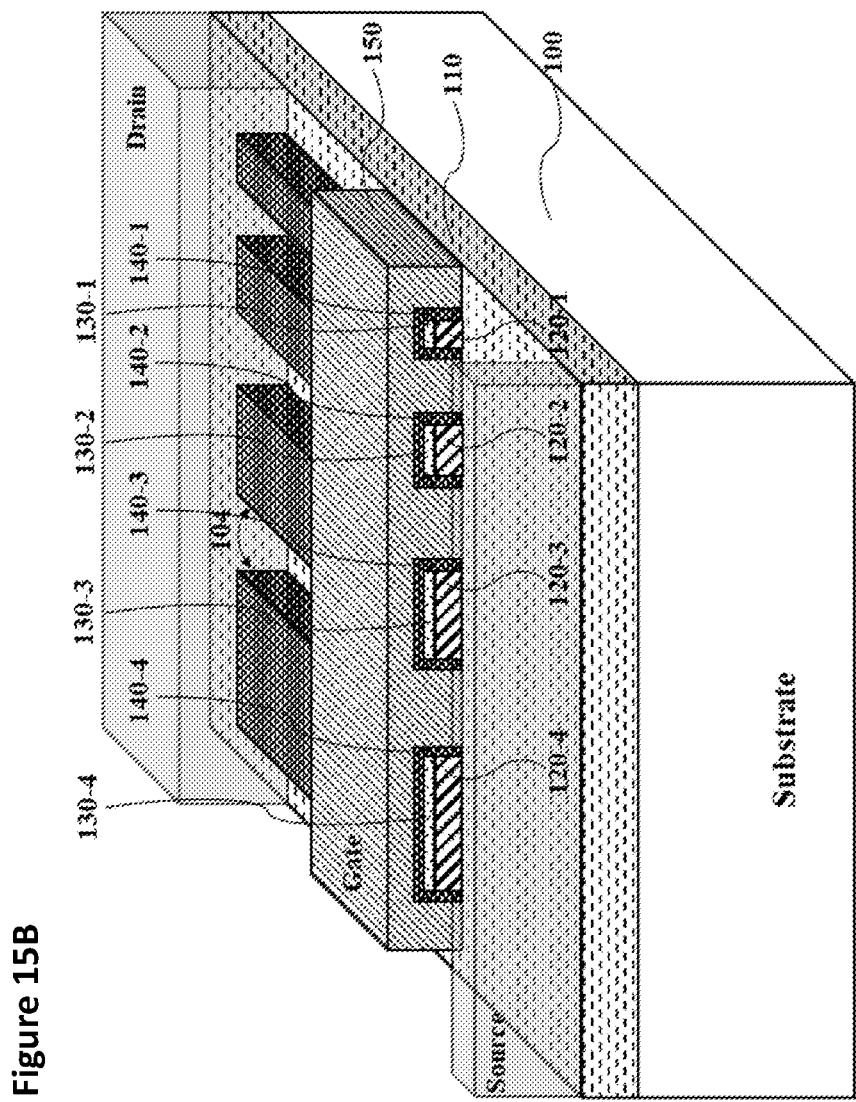
Figure 15C:
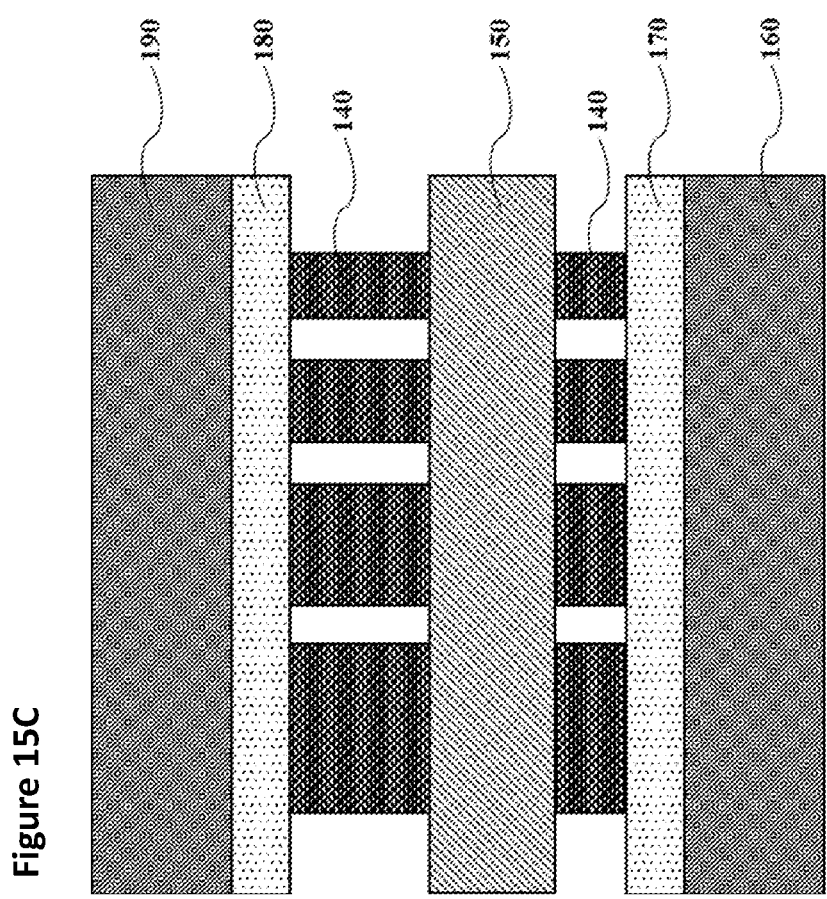

FIGS. 15A-15C illustrate an example embodiment multi-Fin MIS-HEMTs semiconductor device architecture. The structure includes a substrate 100, a buffer 110, multi-layer fins 120-n, 130-n having fin to fin distances 104, gate insulator 140-n and gate metal 150. In the example embodiment according to the present invention, the multi-Fin MIS-HEMT includes gate metal 150 and gate insulator 140-n covering multiple AlGaN/GaN fins 130-n, 120-n, sitting on top of the GaN buffer layer 110 atop a substrate 100. The AlGaN/GaN fins 130-n, 120-n have a width of 40 nm-500 nm, and a height of 30 nm~1 μm. The fin edge-to-edge distance 104 can also vary from few nano meters to few microns.

Figure 16A:
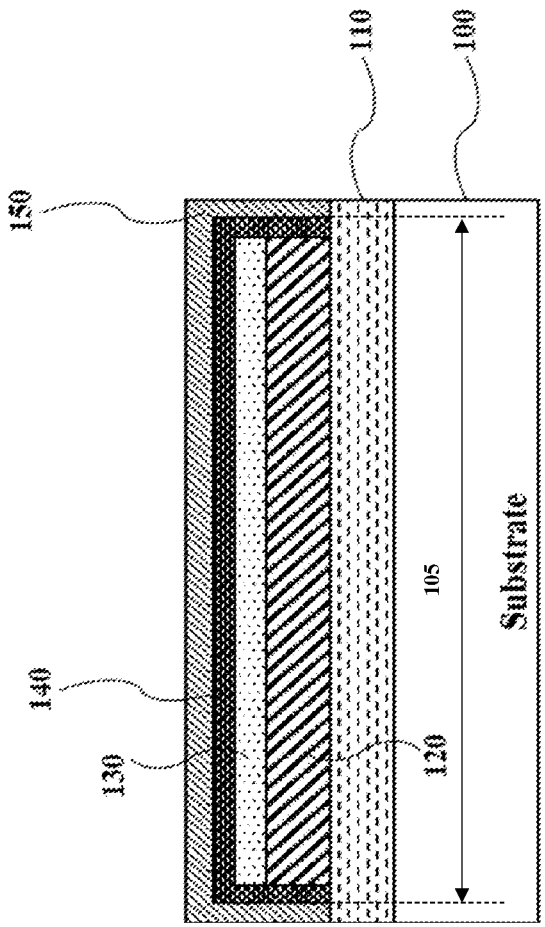
FIGS. 16A-16C are respective fragmentary cross-sectional, side perspective and top views schematically showing a planar MIS-HEMT that is combined with multi-fin FETs according to the present invention.
Figure 16B:
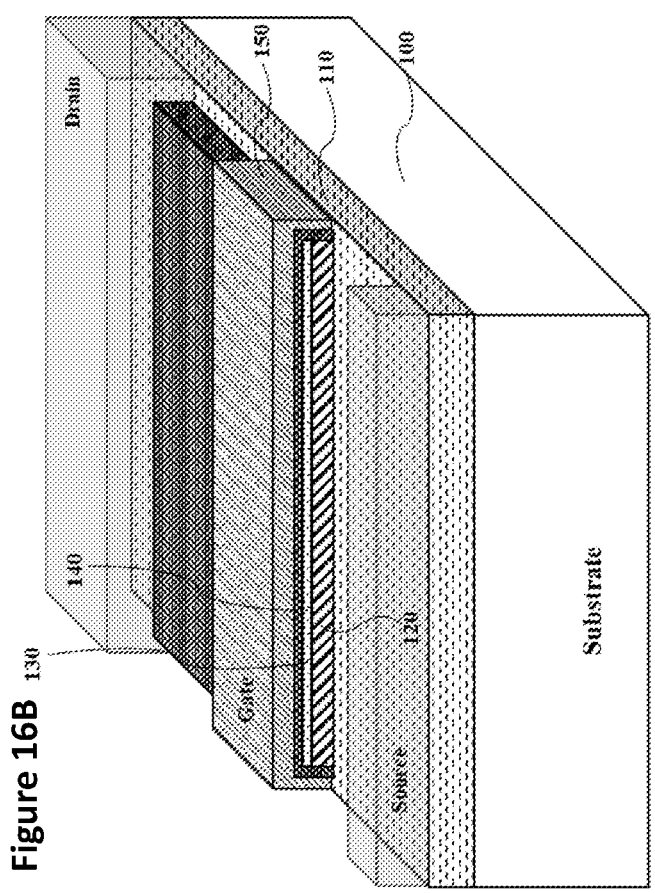
Figure 16C:
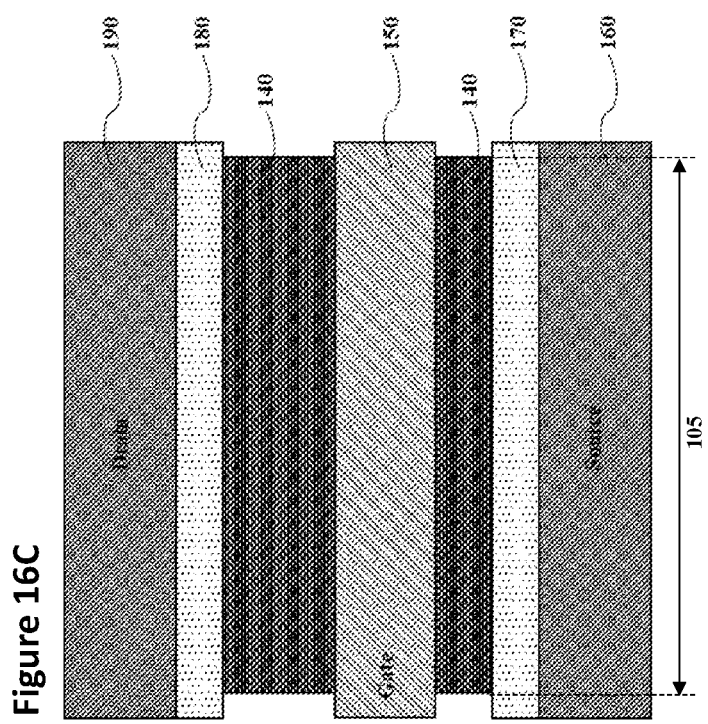
Figure 17:
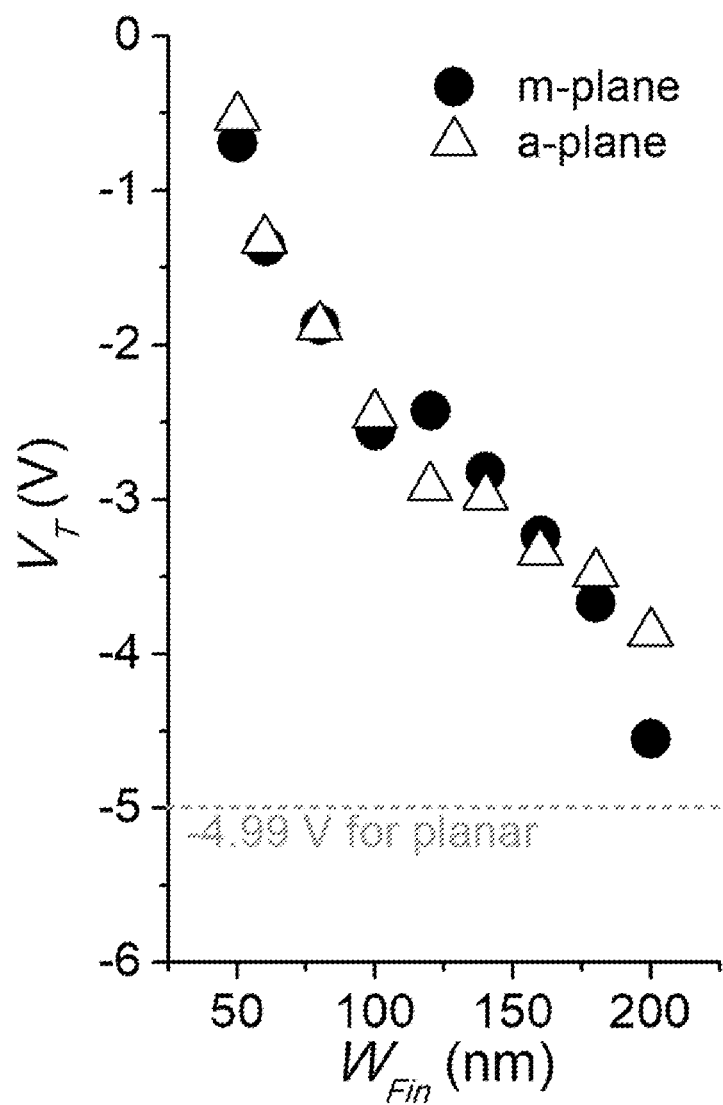
FIG. 17 is data plot of threshold voltages ($V_T$) as a function of fin widths ($W_{Fin}$).

FIGS. 16A-16C illustrate an example embodiment planar MIS-HEMTs semiconductor device architecture that is used with multi-fin architectures described above. The structure includes a substrate 100, a buffer 110, a channel-layer 120, a barrier layer 130, a gate insulator 140 and a gate metal 150. In the example embodiment according to the present invention, the planar MIS-HEMT includes gate metal 150 and gate insulator 140 covering AlGaN/GaN layers 130, 120, sitting on top of the GaN buffer layer 110 atop a substrate 100. The width of channel 105 is larger than 1000 nm, as it is a planar channel device. The thickness of gate insulator 140 and AlGaN barrier layer 130 can also vary from few nanometers to few tens of nano meters. In FIG. 16B, conduction channels will be formed at the interface between 1) 130 and 120, and 2) 140 and 120. 2DEG will be formed at 130 and 120, and the channel will be formed at 140 and 120. In this planar device structure, the sidewall channel will be negligible, because the 2DEG is more conductive and the length is longer than the channel Preferred embodiment devices have a number of applications. One application is to replace conventional planar or Fin-HEMTs for mm-wave applications. Its intrinsically tunable capability with very wide $V_{GS}$ ranges allows for wideband linearity, along with high $f_T$, $f_{max}$ and low noise performance. The present multi-Fin MIS-HEMT device is expected to yield linearity over wider gate voltages through the utility of multiple Fin channels, open up the possibility of using low metal work function due to absence of or minimal gate leakage currents in the MIS-HEMT devices compared to HEMT devices as a gate thereby enabling additional control over threshold voltage engineering for the superposition of drain currents for linearization, scalability to extremely short gate lengths (20 nm target) without risking substantial increases in series resistances due to the use of multi-Fin width devices.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A MIS-HEMT, comprising a substrate, a buffer layer upon the substrate, a plurality of multi-layer fins having a plurality of widths including fins with largest, intermediate and smallest widths, each fin having channel material and barrier material, wherein the plurality of multi-layer fins are formed upon the buffer layer, a gate insulator surrounds the plurality of multi-layer fins and gate metal conformally covers the gate insulator, wherein the largest, intermediate and smallest widths, are selected to lead to different turn-on voltage thresholds for the fins that have the largest, intermediate and smallest widths, such that a transconductance $g_m$ curve of the MIS-HEMT exhibits a peak transconductance plateau over an operational range of gate-source voltage.

2. The MIS-HEMT of claim 1, wherein the channel material in each of the plurality of multi-layer fins forms a planar channel.

3. The MIS-HEMT of claim 2, wherein the plurality of multi-layer fins are sized such that their current carrying capacity becomes larger than the planar channel to provide current linearization over the operational range.

4. The MIS-HEMT of claim 2, wherein the planar channel comprises a width greater than 1 μm, and all of the plurality of widths are less than 500 nm.

5. The MIS-HEMT of claim 1, wherein the plurality of multi-layer fins comprises multiple AlGaN/GaN fins and the gate insulator comprises one of $Al_2O_3$ and $HfO_2$.

6. The MIS-HEMT of claim 1, wherein the plurality of multi-layer fins comprises families of fins, each family including a plurality of fins, with each family structured and sized to turn on at a different bias voltage.

7. The MIS-HEMT of claim 6, wherein a number of fins of each family is proportional to a threshold voltage and current overdrive and varies from one fin family to another fin family.

8. The MIS-HEMT of claim 1, wherein the plurality of widths are selected such that the threshold voltages ($V_T$) and a peak point of transconductance $g_m$ of single fins from the plurality of multi-layer fins lift up a decreasing region of transconductance $g_m$ at higher VGS in larger fins of the plurality of multi-layer fins.

9. The MIS-HEMT of claim 1, wherein the plurality of widths are selected such that threshold voltage $V_T$ and $g_{m,peak}$ shift of transconductance $g_m$ contributed by a larger fin in a decreasing region of transconductance $g_m$ are compensated by smaller fins that have increasing $g_m$ at in the decreasing region of $g_m$ of the large fin.

10. The MIS-HEMT of claim 1, comprising unetched source and drain regions.

11. The MIS-HEMT of claim 1, wherein the channel and barrier materials comprise Group III-V materials.

12. The MIS-HEMT of claim 1, wherein the channel and barrier materials comprise silicon with different ion-implant doses.

13. The MIS-HEMT of claim 1, wherein the plurality of widths are selected such that the plurality of multi-layer fins are uniformly separated from each other by gate voltages in second derivative of transconductance $g_m''$ curves of the plurality multi-layer fins to complement each other for reducing the first derivative of transconductance $g_m'$ close to zero over the operational range.

* * * * *